(12) United States Patent
Gaben

(10) Patent No.: US 11,664,550 B2
(45) Date of Patent: May 30, 2023

(54) ENCAPSULATION SYSTEM FOR ELECTRONIC COMPONENTS AND BATTERIES

(71) Applicant: I-TEN, Dardilly (FR)

(72) Inventor: Fabien Gaben, Dardilly (FR)

(73) Assignee: I-TEN, Dardilly (FR)

( * ) Notice: Subject to any disclaimer, the term of this patent is extended or adjusted under 35 U.S.C. 154(b) by 0 days.

(21) Appl. No.: 17/816,904

(22) Filed: Aug. 2, 2022

(65) Prior Publication Data

US 2023/0008348 A1 Jan. 12, 2023

Related U.S. Application Data

(62) Division of application No. 16/625,866, filed on Dec. 23, 2019, now Pat. No. 11,469,464.

(51) Int. Cl.

| | |
|---|---|
| *H01M 10/0585* | (2010.01) |
| *H01M 50/121* | (2021.01) |
| *H01M 50/124* | (2021.01) |
| *C23C 16/455* | (2006.01) |
| *H01M 10/0525* | (2010.01) |
| *H01M 50/10* | (2021.01) |
| *H01M 50/116* | (2021.01) |
| *H01M 50/141* | (2021.01) |

(52) U.S. Cl.
CPC ..... *H01M 50/124* (2021.01); *C23C 16/45555* (2013.01); *H01M 10/0525* (2013.01); *H01M 10/0585* (2013.01); *H01M 50/10* (2021.01); *H01M 50/116* (2021.01); *H01M 50/121* (2021.01); *H01M 50/141* (2021.01); *H01M 2220/30* (2013.01)

(58) Field of Classification Search
CPC .......... H01M 10/0585; H01M 50/124; H01M 50/449; H01M 10/0525; H01M 6/40
See application file for complete search history.

(56) References Cited

U.S. PATENT DOCUMENTS

| 5,561,004 A | 10/1996 | Bates et al. |
|---|---|---|
| 2002/0071989 A1 | 6/2002 | Verma et al. |

(Continued)

FOREIGN PATENT DOCUMENTS

| CN | 105552254 A | 5/2016 |
|---|---|---|
| EP | 2868770 A1 | 5/2015 |

OTHER PUBLICATIONS

International Search Report and Written Opinion for International Patent Application No. PCT/FR2018/051582, dated Jun. 28, 2018, 16 pages.

*Primary Examiner* — Imran Akram
(74) *Attorney, Agent, or Firm* — Jordan IP Law, LLC; Todd A. Vaughn

(57) ABSTRACT

Systems, methods, and apparatus for encapsulating objects like that of microelectronic components and batteries. The system includes three successive layers that include a first covering layer composed of an electrically insulating material deposited by atomic layer deposition, which at least partly covers the object, a second covering layer that includes parylene and/or polyimide, and which is disposed on the first covering layer, and a third covering layer deposited on the second covering layer in such a way as to protect the second encapsulation layer, namely, with respect to oxygen, and thereby increase the service life of the object.

17 Claims, 15 Drawing Sheets

(56) References Cited

U.S. PATENT DOCUMENTS

| | | | |
|---|---|---|---|
| 2007/0012244 A1* | 1/2007 | Klaassen | B32B 15/08 |
| | | | 29/623.5 |
| 2010/0129717 A1* | 5/2010 | Bedjaoui | H01M 50/124 |
| | | | 429/231.95 |
| 2012/0135292 A1* | 5/2012 | Buckingham | H01M 50/121 |
| | | | 427/126.3 |
| 2013/0026969 A1* | 1/2013 | Kim | H01M 50/107 |
| | | | 320/103 |
| 2015/0118544 A1* | 4/2015 | Oukassi | H10K 71/00 |
| | | | 427/430.1 |
| 2015/0188186 A1* | 7/2015 | Bedjaoui | H05K 3/305 |
| | | | 29/841 |
| 2016/0211498 A1* | 7/2016 | Kim | H01M 10/056 |
| 2016/0293905 A1* | 10/2016 | Bedjaoui | H01M 10/0585 |
| 2017/0025646 A1* | 1/2017 | Ota | H01M 50/103 |
| 2019/0165342 A1* | 5/2019 | Berland | H01M 6/40 |

* cited by examiner

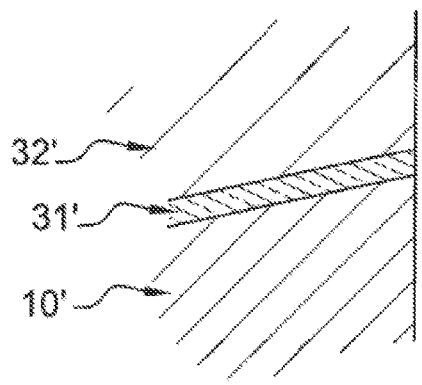
Figure 23
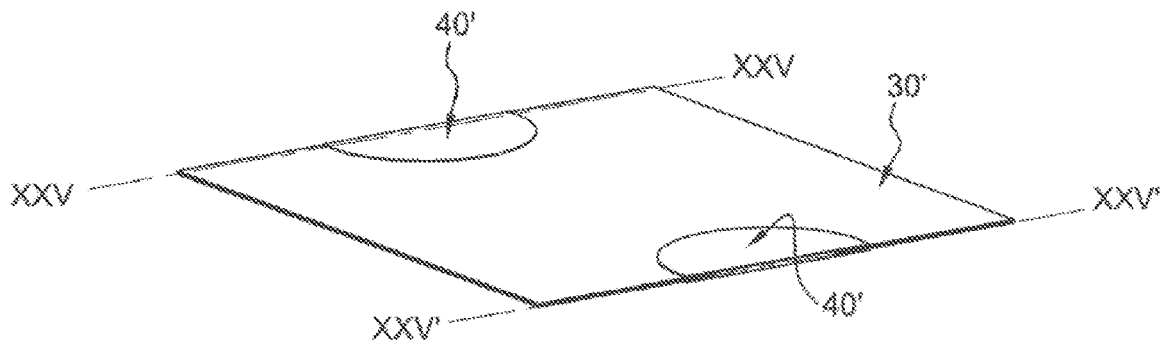
Figure 24
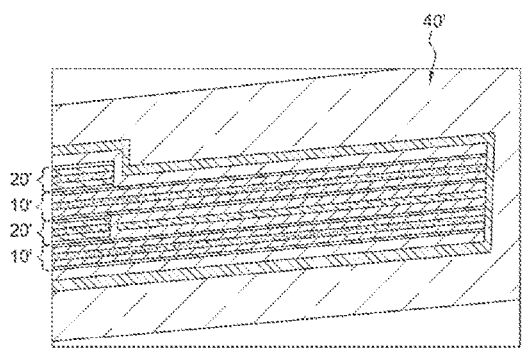
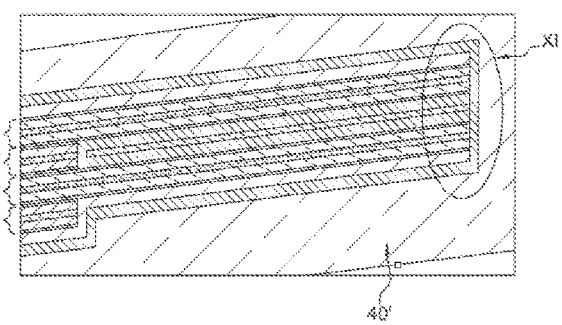
Figure 25A             Figure 25B

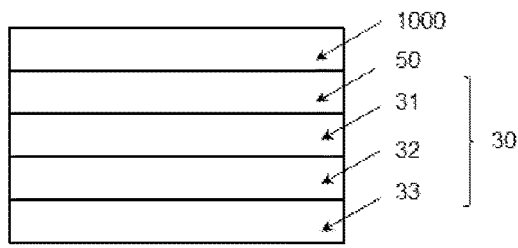
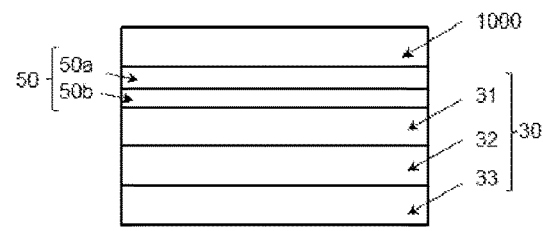
Figure 29A                        Figure 29B
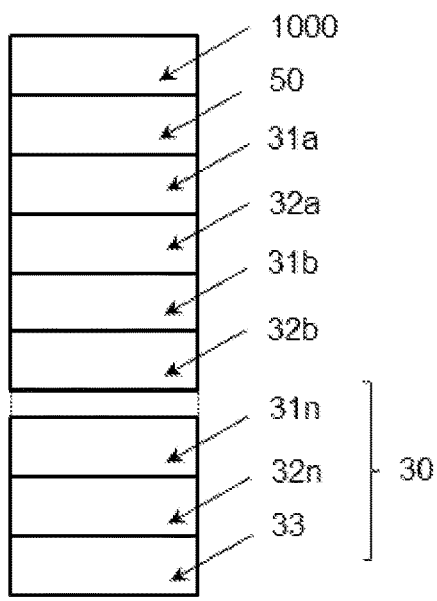
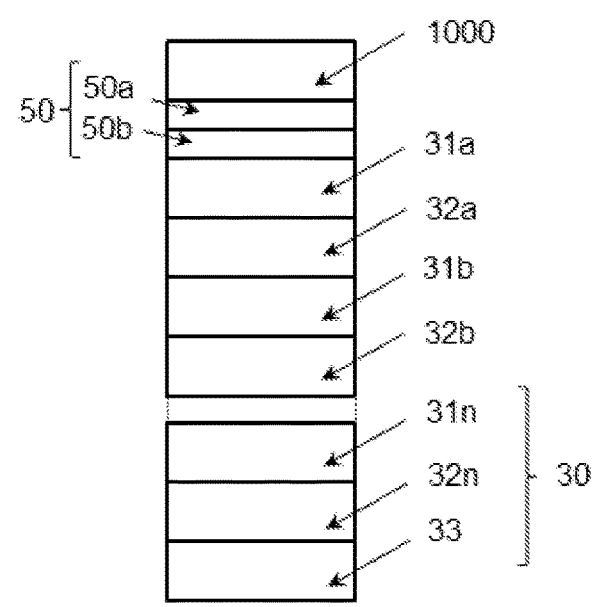
Figure 30A                        Figure 30B
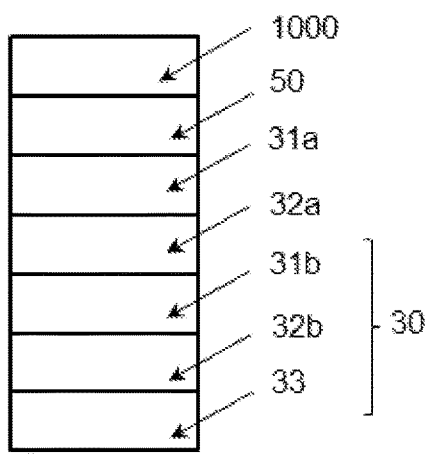
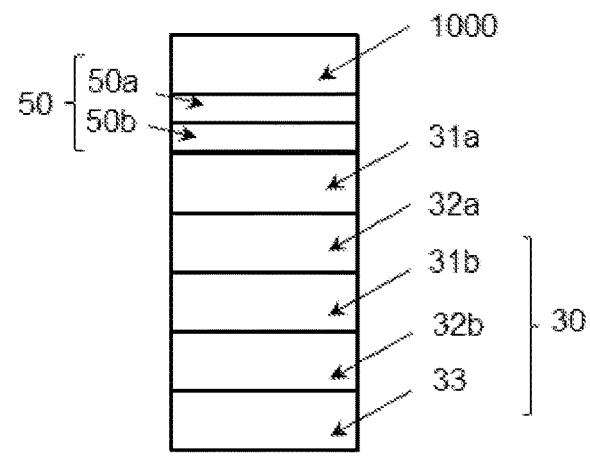
Figure 31A                        Figure 31B

ENCAPSULATION SYSTEM FOR ELECTRONIC COMPONENTS AND BATTERIES

CROSS-REFERENCE TO RELATED APPLICATIONS

The present application is a divisional of U.S. patent application Ser. No. 16/625,866 (filed Dec. 23, 2019), which is a National Stage Application of PCT International Application No. PCT/FR2018/051582 (filed on Jun. 28, 2018), under 35 U.S.C. § 371, which claims priority to French Patent Application Nos. 1756079 (filed on Jun. 29, 2017), 1756364 (filed on Jul. 6, 2017), and 1853930 (filed on May 7, 2019), which are each hereby incorporated by reference in their complete respective entireties.

TECHNICAL FIELD

The present invention relates to systems for encapsulating objects like of that microelectronic components and batteries. It relates more particularly to the field of batteries, and namely lithium-ion batteries, which can be encapsulated in this manner. The invention also relates to a novel method for manufacturing thin film lithium-ion batteries, having a novel architecture and encapsulation that confer on them a particularly low self-discharge, and an improved service life.

BACKGROUND

Microelectronic components and batteries, and in particular thin film batteries, must be encapsulated in order to be durable since oxygen and humidity degrade them. In particular, lithium-ion batteries are very sensitive to humidity, and need an encapsulation that provides them with a service life greater than 10 years. With the spread of portable electronic devices and networks of autonomous sensors, the need for rechargeable batteries with high energy density and high power density has grown considerably. Thin film lithium-ion batteries have a high energy density and a high power density, are rechargeable, and do not have a memory effect: they are capable of meeting this need, but their reliability and their service life remain critical factors.

Thin film lithium-ion batteries comprise electrodes and an electrolyte that are entirely solid, that is to say devoid of liquid. The thickness of the various layers that form them normally does not exceed 10 µm, and is often comprised between 1 and 4 µm. It is observed that these thin film batteries, such as multilayer batteries, are sensitive to self-discharge. According to the positioning of the electrodes, namely the proximity of the edges of the electrodes for multilayer batteries and the cleanliness of the cuts, a leak current can appear on the ends, a creeping short circuit that reduces the performance of the battery. This phenomenon is exacerbated if the film of electrolyte is very thin.

These all-solid thin film lithium-ion batteries most often use anodes comprising a layer of metallic lithium. It is observed that the anode materials have a high variation in their volume during the cycles of charge and discharge of the battery. Indeed, during a cycle of charge and discharge, a portion of the metallic lithium is transformed into lithium ions that insert themselves into the structure of the cathode materials, which is accompanied by a reduction in the volume of the anode. This cyclic variation of the volume can deteriorate the mechanical and electrical contacts between the layers of electrodes and of electrolyte. This reduces the performance of the battery over its life.

The cyclic variation of the volume of the anode materials also induces a cyclic variation of the volume of the cells of the batteries. It thus engenders cyclic stresses on the encapsulation system, capable of initiating cracks that are responsible for the loss of sealing (or even of integrity) of the encapsulation system. This phenomenon is another cause of the reduction in the performance of the battery over its life Indeed, the active materials of lithium-ion batteries are very sensitive to air and in particular to humidity. The mobile lithium ions spontaneously react with traces of water to form LiOH, leading to calendar aging of the batteries. Not all the materials for insertion of and electrolytes conductive of the lithium ions are reactive upon contact with humidity. For example, $Li_4Ti_5O_{12}$ does not deteriorate upon contact with the atmosphere or with traces of water. On the contrary, as soon as it is charged with lithium in the form $Li_{4+x}Ti_5O_{12}$ with x>0, then as for the surplus of lithium inserted (x), it is sensitive to the atmosphere and reacts spontaneously with the traces of water to form LiOH. The lithium that has reacted is therefore no longer available for the storage of electricity, inducing a loss of capacity of the battery.

In order to avoid the exposure of the active materials of the lithium-ion battery to air and to water and prevent this type of aging, it is essential to protect it by an encapsulation system. Numerous encapsulation systems for thin film batteries are described in the literature.

The document US 2002/0 071 989 describes a system for encapsulating an all-solid thin film battery comprising a stack of a first layer of a dielectric material chosen from alumina ($Al_2O_3$), silica ($SiO_2$), silicon nitride ($Si_3N_4$), silicon carbide (SiC), tantalum oxide ($Ta_2O_5$) and amorphous carbon, of a second layer of a dielectric material and of a sealing layer disposed on the second layer and covering the totality of the battery.

The document U.S. Pat. No. 5,561,004 describes a plurality of systems for protection of a thin film lithium-ion battery. A first proposed system comprises a layer of parylene covered with an aluminum film deposited on the active components of the battery. However, this system of protection against the diffusion of the air and of the water vapor is only effective for approximately one month. A second proposed system comprises alternating layers of parylene (500 nm thick) and of metal (approximately 50 nm thick). The document specifies that it is preferable to also coat these batteries with a layer of epoxy hardened with ultraviolet radiation (UV) in such a way as to reduce the speed of degradation of the battery by atmospheric elements.

According to the prior art most lithium-ion batteries are encapsulated in metallized sheets of polymer (called "pouch") closed around the battery cell and heat sealed at the connector tapes (called "tabs"). This packaging is relatively flexible and the positive and negative connections of the battery are thus embedded in the heat-sealed polymer that was used to close the packaging around the battery. However, this welding between the sheets of polymer is not totally impermeable to the gases of the atmosphere, the polymers used to heat seal the battery are rather permeable to the gases of the atmosphere. It is observed that the permeability increases with the temperature, which accelerates aging.

However the surface of these welds exposed to the atmosphere remains very small, and the rest of the packaging consists of aluminum sheets sandwiched between these sheets of polymer. In general, two sheets of aluminum are associated in order to minimize the effects related to the presence of holes, of defects in each of these sheets of aluminum. The probability of two defects, on each of the foils being aligned is greatly reduced.

These packaging technologies allow to guarantee approximately 10 to 15 years of calendar service life for a 10 Ah battery with a surface area of 10×20 cm2, under normal conditions of use. If the battery is exposed to a high temperature, this service life can be reduced to less than 5 years; this remains insufficient for numerous uses. Similar technologies can be used for other electronic components, such as capacitors, active components.

Consequently, there is a need for systems and methods for encapsulating thin film batteries and other electronic components, which protects the component against air, humidity and the effects of temperature. More particularly there is a need for systems and methods for encapsulating thin film lithium-ion batteries, which protects them against air and humidity as well as against their deterioration when the battery is subjected to charge and discharge cycles. The encapsulation system must be impermeable and hermetic, must envelop and cover the component or the battery totally, must be sufficiently flexible to be able to accompany slight changes in dimensions ("breaths") of the battery cell, and must also allow to galvanically separate the edges of electrodes having opposite signs in order to avoid any creeping short circuit.

One goal of the present invention is to at least partially overcome the disadvantages of the prior art mentioned above.

Another goal of the present invention is to propose lithium-ion batteries provided with a very long service life and having a low self-discharge.

SUMMARY

At least one of the goals above is achieved by means of at least one of the objects according to the invention as presented below. The present invention proposes as a first object a system 30 for encapsulating an object 1000 such as an electronic or electrochemical component such as a battery, characterized in that it is formed by three successive layers comprising:

i. a first covering layer 31, 31' composed of an electrically insulating material deposited by atomic layer deposition (hereinafter ALD, acronym for Atomic Layer Deposition), which at least partly covers said object, ii. a second covering layer 32, 32' comprising parylene and/or polyimide, disposed on the first covering layer, iii. a third covering layer 33, 33' deposited on the second covering layer in such a way as to protect the second encapsulation layer, namely, with respect to oxygen, and to increase the service life of the object.

Advantageously, the system for encapsulating an object comprises a covering layer comprising parylene and/or polyimide, preferably parylene N and an encapsulation system 30 deposited on said covering layer comprising parylene and/or polyimide.

Advantageously, the third covering layer 33, 33' contains epoxy resin, polyethylene naphthalate (PEN), polyimide, polyamide, polyurethane or silicone.

A second object of the invention is an electronic or electrochemical component such as a battery, preferably a thin film battery comprising an encapsulation system 30. Another object of the invention is an electrochemical component, said component being a thin film battery, said battery comprising:

a stack alternating between at least one anode 10, 10' and at least one cathode 20, 20', each consisting of a stack of thin films and wherein the anode 10, 10' comprises at least one thin film of an active anode material 12, and optionally a thin film of an electrolyte material 13, and in which stack the cathode 20, 20' comprises at least one thin film of an active cathode material 22, and optionally a thin film of an electrolyte material 23 so that that the battery successively comprises at least one thin film of an active anode material 12, at least one thin film of an electrolyte material 13,23 and at least one thin film of an active cathode material 22, an encapsulation system 30 in which said first layer 31,31' at least partly covers the stack, said encapsulation system 30 partly covering said stack, a first anode 10 or cathode 20 comprising at least one accessible connection zone, while the adjacent cathode 20 or the anode 10 comprises a covering zone ZRT, which is covered by at least said first covering layer 31,31' and said second covering layer 32,32', said covering zone being located facing the connection zones ZC of the first anode or cathode, in a direction perpendicular to the plane of said stack.

Another object of the invention is a method for manufacturing an encapsulated electronic or electrochemical component, comprising the formation of an encapsulation system 30 and wherein the following are successively deposited in such a way as to form said encapsulation system 30:

(i) a first covering layer 31,31' composed of an electrically insulating material by ALD, (ii) a second covering layer 32,32' comprising parylene and/or polyimide, deposited on said first covering layer, (iii) a third covering layer 33,33', deposited on the second covering layer, able to, and deposited in such a way as to, protect the second encapsulation layer namely from oxygen.

Another object of the invention is a method for manufacturing an electronic component or an encapsulated battery, comprising the formation of an encapsulation system according to the invention and wherein the following are successively deposited in such a way as to form said encapsulation system:

a pretreatment layer comprising parylene and/or polyimide on said electronic or electrochemical component, a first covering layer 31,31' composed of an electrically insulating material by ALD deposited on said covering layer comprising parylene and/or polyimide, a second covering layer 32,32' comprising parylene and/or polyimide, deposited on said first covering layer, a third covering layer 33,33', deposited on the second covering layer, able to, and deposited in such a way as to, protect the second encapsulation layer namely from oxygen.

Yet another object of the invention is a method for manufacturing a thin film battery, said battery comprising a stack alternating between at least one anode 10, 10' and at least one cathode 20, 20', each consisting of a stack of thin films and wherein the anode 10, 10' comprises:

at least one thin film of an active anode material 12, and optionally a thin film of an electrolyte material 13, and wherein the cathode 20, 20' comprises at least one thin film of an active cathode material 22, and optionally a thin film of an electrolyte material 23 so that the battery successively comprises at least one thin film of an active anode material 12, at least one thin film of an electrolyte material 13,23 and at least one thin film of an active cathode material 22, said method comprising the following steps:

(a) a primary superposition is formed, comprising an alternating succession of sheets of cathode and of sheets of anode, said primary superposition being intended to form at least one battery, two adjacent sheets defining at least one protruding region RS, intended to form said accessible connection zone ZC, as well as at least one set-back region RT, intended to form said covering zone RTC, (b) the encapsulation system according to the invention is deposited by the method described above.

Advantageously, after step (b), the accessible connection zone ZC or each accessible connection zone ZC are revealed.

In one embodiment, after step (b), a step (c) is carried out comprising at least one primary cut perpendicularly to the plane of said primary superposition in such a way as to make accessible a connection zone ZC at the anode hereinafter anode connection zone and at least one primary cut is carried out perpendicularly to the plane of said primary superposition in such a way as to make accessible a connection zone ZC at the cathode hereinafter cathode connection zone.

Advantageously, the primary cuts are carried out at opposite edges of said primary superposition.

In a first embodiment, the edges of two adjacent sheets of the primary superposition comprising an alternating succession of sheets of cathode and of sheets of anode are straight edges, the edge of a first sheet forming the protruding region RS while the edge of a second sheet forming the set-back region RR.

In a second embodiment, first notches 50, 50', 50", 50''' having a first or big cross-section are made in the edge of a first sheet of the primary superposition comprising an alternating succession of sheets of cathode and of sheets of anode, the wall of said first notches forming said set-back region RR, and second notches having a second or small cross-section, smaller than the first cross-section, are made in a second adjacent sheet, the wall of said second notches 50, 50', 50", 50''' forming said protruding region RS.

Advantageously, the sheets of cathode and the sheets of anode, have notches 50, 50', 50", 50''' in the shape of a circle.

Advantageously, first orifices having a first or big cross-section are made in a first sheet, the wall of said orifices forming said set-back region RR, second orifices having a second or small cross-section, smaller than the first cross-section, are made in a second adjacent sheet, the wall of said orifices forming said protruding region RS, the inner volume of said orifices is filled via the encapsulation system or one of these alternatives and at least one secondary cut, preferably each secondary cut, is made inside said first and second orifices, so that the connection zones ZC are formed near the walls having the small cross-section and the covering zones are formed near the walls having the big cross-section.

Advantageously, in two adjacent sheets, first and second slots, mutually offset in the direction perpendicular to the plane of said sheets, are made, the inner volume of said slots is filled via the encapsulation system and at least one secondary cut, preferably each secondary cut, is made inside said slots, so that the connection zones are formed near the walls of a first slot and the covering zones are formed near the walls of a second slot.

Advantageously, after step (c), the anode and cathode connection zones ZC are electrically connected to each other by thin-film deposition of an electronic conductor and wherein the deposition is carried out by ALD 41, 41'.

Advantageously, anode and cathode interconnections 40, 40' are made by metallization of the sections previously covered with a thin film of an electronic conductor.

Advantageously, after step (c), the anode and cathode connection zones are electrically connected to each other by an interconnection system successively comprising:
- a first electronically conductive layer, preferably metallic, optional, preferably deposited by ALD 41, 41',
- a second layer 42, 42' containing epoxy resin loaded with silver, deposited on the first electronically conductive layer, and
- a third layer 43, 43' containing tin, deposited on the second layer.

In another embodiment, after step (c), the anode and cathode connection zones are electrically connected to each other by an interconnection system successively comprising:
- a first electronically conductive layer, preferably metallic, optional, preferably deposited by ALD 41,
- a second layer 42 containing epoxy resin loaded with silver, deposited on the first electronically conductive layer, and
- a third layer 43a containing nickel, deposited on the second layer,
- a fourth layer 43b containing tin or copper, deposited on the third layer.

Advantageously, the sheets have dimensions clearly greater than those of the final battery, characterized in that at least one other cut called tertiary is made, in a median portion of said sheets.

Advantageously, said electrically insulating material is chosen from non-conductive organic or inorganic polymer materials having barrier properties with regard to water. Advantageously, said electrically insulating material is chosen from Al2O3, SiO2, SiOyNx and the epoxy resins.

Advantageously, the second covering layer comprises parylene N.

Advantageously, the thickness of the first covering thin film is less than 200 nm, preferably between 5 nm and 200 nm, and even more preferably approximately 50 nm and the thickness of the second covering layer is between 1 µm and 50 µm, preferably approximately 10 µm.

Advantageously, the thickness of the third covering thin film is between 1 µm and 50 µm, preferably less than 10 µm, preferably less than 5 µm and even more preferably approximately 2 µm.

Advantageously, the layer of anode material is made from a material chosen from:

(i) the oxynitrides of tin (having the typical formula SnOxNy);

(ii) lithiated iron phosphate (having the typical formula LiFePO4);

(iii) the mixed oxynitrides of silicon and tin (having the typical formula SiaSnbOyNz with a>0, b>0, a+b≤2, 0<y≤4, 0<z≤3) (also called SiTON), and in particular SiSn0.87O1.2N1.72; as well as the oxynitride-carbides having the typical formula SiaSnbCcOyNz with a>0, b>0, a+b≤2, 0<c<10, 0<y<24, 0<z<17; SiaSnbCcOyNzXn with X at least one of the elements out of F, Cl, Br, I, S, Se, Te, P, As, Sb, Bi, Ge, Pb and a>0, b>0, a+b>0, a+b≤2, 0<c<10, 0<y<24 and 0<z<17; and SiaSnbOyNzXn with Xn at least one of the elements out of F, Cl, Br, I, S, Se, Te, P, As, Sb, Bi, Ge, Pb and a>0, b>0, a+b≤2, 0<y≤4 and 0<z≤3;

(iv) the nitrides of the type SixNy (in particular with x=3 and y=4), SnxNy (in particular with x=3 and y=4), ZnxNy (in particular with x=3 and y=4), Li3-xMxN (with M=Co and 0≤x≤0.5, with M=Ni and 0≤x≤0.6 or with M=Cu and 0≤x≤0.3);

(v) the oxides SnO2, Li4Ti5O12, SnB0.6P0.4O2.9 and TiO2.

Advantageously, the layer of cathode material can be made from a cathode material chosen from:
- the oxides LiMn2O4, LiCoO2, LiNiO2, LiMn1.5Ni0.5O4, LiMn1.5Ni0.5-xXxO4 where X is chosen from Al, Fe, Cr, Co, Rh, Nd, other rare earths such as Sc, Y, Lu, La, Ce, Pr, Pm, Sm, Eu, Gd, Tb, Dy, Ho, Er, Tm, Yb, and where $0<x<0.1$, LiMn2-xMxO4 with M=Er, Dy, Gd, Tb, Yb, Al, Y, Ni, Co, Ti, Sn, As, Mg or a mixture of these compounds and where $0<x<0.4$, LiFeO2, LiMn1/3Ni1/3Co1/3O2, LiNi0.8Co0.15Al0.05O2,
- the phosphates LiFePO4, LiMnPO4, LiCoPO4, LiNiPO4, Li3V2(PO4)3; the phosphates having the formulae LiMM'PO4, with M and M' (M≠M') selected from Fe, Mn, Ni, Co, V;
- all the lithiated forms of the following chalcogenides: V2O5, V3O8, TiS2, the oxysulfides of titanium (TiOySz with $z=2-y$ and $0.3 \leq y \leq 1$), the oxysulfides of tungsten (WOySz with $0.6<y<3$ and $0.1<z<2$), CuS, CuS2, preferably LixV2O5 with $0<x \leq 2$, LixV3O8 with $0<x \leq 1.7$, LixTiS2 with $0<x \leq 1$, the LixTiOySz oxysulfides of titanium and of lithium with $z=2-y$, $0.3 \leq y \leq 1$, LixWOySz, LixCuS, LixCuS2.

Advantageously, the layer of electrolyte material is made from electrolyte material chosen from:
- the garnets having the formula LidA1xA2y(TO4)z where
  - A1 represents a cation having the degree of oxidation +II, preferably Ca, Mg, Sr, Ba, Fe, Mn, Zn, Y, Gd; and where
  - A2 represents a cation having the degree of oxidation +III, preferably Al, Fe, Cr, Ga, Ti, La; and where
  - (TO4) represents an anion in which T is an atom having the degree of oxidation +IV, located at the center of a tetrahedron formed by the atoms of oxygen, and in which TO4 advantageously represents the silicate or zirconate anion, knowing that all or a portion of the elements T having a degree of oxidation +IV can be replaced by atoms having a degree of oxidation +III or +V, such as Al, Fe, As, V, Nb, In, Ta;
  - knowing that: d is between 2 and 10, preferably between 3 and 9, and even more preferably between 4 and 8; x is 3 but can be between 2.6 and 3.4 (preferably between 2.8 and 3.2); y is 2 but can be between 1.7 and 2.3 (preferably between 1.9 and 2.1) and z is 3 but can be between 2.9 and 3.1;
- the garnets, preferably chosen from: Li7La3Zr2O12; Li6La2BaTa2O12; Li5.5La3Nb1.75In0.25O12; Li5La3M2O12 with M=Nb or Ta or a mixture of the two compounds; Li7-xBaxLa3-xM2O12 with $0 \leq x \leq 1$ and M=Nb or Ta or a mixture of the two compounds; Li7-xLa3Zr2-xMxO12 with $0 \leq x \leq 2$ and M=Al, Ga or Ta or a mixture of two or three of these compounds;
- the lithiated phosphates, preferably chosen from: the lithiated phosphates of the NASICON type; Li3PO4; LiPO3; the Li3Al0.4Sc1.6(PO4)3 called "LASP"; Li3(Sc2-xMx)(PO4)3 with M=Al or Y and $0 \leq x \leq 1$; Li1+xMx(Sc)2-x(PO4)3 with M=Al, Y, Ga or a mixture of the three compounds and $0 \leq x \leq 0.8$; Li1+xMx(Ga1-yScy)2-x(PO4)3 with $0 \leq x \leq 0.8$; $0 \leq y \leq 1$ and M=Al or Y or a mixture of the two compounds; Li1+xMx(Ga)2-x(PO4)3 with M=Al, Y or a mixture of the two compounds and $0 \leq x \leq 0.8$; the $Li_{1+x}AlxTi2-x(PO4)3$ with $0 \leq x \leq 1$ called "LATP"; or the Li1+xAlxGe2-x(PO4)3 with $0 \leq x \leq 1$ called "LAGP"; or Li1+x+zMx(Ge1-yTiy)2-xSizP3-zO12 with $0 \leq x \leq 0.8$ and $0 \leq y \leq 1.0$ and $0 \leq z \leq 0.6$ and M=Al, Ga or Y or a mixture of two or three of these compounds; Li3+y(Sc2-xMx)QyP3-yO12 with M=Al and/or Y and Q=Si and/or Se, $0 \leq x \leq 0.8$ and $0 \leq y \leq 1$; or Li1+x+yMxSc2-xQyP3-yO12 with M=Al, Y, Ga or a mixture of the three compounds and Q=Si and/or Se, $0 \leq x \leq 0.8$ and $0 \leq y \leq 1$; or Li1+x+y+zMx(Ga1-yScy)2-xQzP3-zO12 with $0 \leq x \leq 0.8$, $0 \leq y \leq 1$, $0 \leq z \leq 0.6$ with M=Al or Y or a mixture of the two compounds and Q=Si and/or Se; or $Li_{1+x}$M3xM2-xP3O12 with $0 \leq x \leq 1$ and M3=Cr and/or V, M=Sc, Sn, Zr, Hf, Se or Si, or a mixture of these compounds;
- the lithiated sulfurated compounds, preferably chosen from: LixAlz-yGaySw(PO4)c with $4<w<20$, $3<x<10$, $0 \leq y<1$, $1 \leftarrow z<4$ and $0<c<20$; LixAlz-yGaySw(BO3)c with $4<w<20$, $3<x<10$, $0 \leq y<1$, $1 \leq z<4$ and $0<c<20$; LixAlz-yScySw(PO4)c $4<w<20$, $3<x<10$, $0 \leq y<1$, $1 \leq z<4$ and $0<c<20$; LixAlz-yScySw(BO3)c $4<w<20$, $3<x<10$, $0 \leq y<1$, $1 \leq z<4$ and $0<c<20$; LixGez-ySiySw(PO4)c $4<w<20$, $3<x<10$, $0 \leq y<1$, $1 \leq z<4$ and $0<c<20$; LixGe(z-y)SiySw(BO3)c with $4<w<20$, $3<x<10$, $0 \leq y<1$, $1 \leq z<4$ and $0<c<20$;
- the lithiated borates, preferably chosen from: Li3(Sc2-xMx)(BO3)3 with M=Al or Y and $0 \leq x \leq 1$; Li1+xMx(Sc)2-x(BO3)3 with M=Al, Y, Ga or a mixture of the three compounds and $0 \leq x \leq 0.8$; Li1+xMx(Ga1-yScy)2-x(BO3)3 with $0 \leq x \leq 0.8$, $0 \leq y \leq 1$ and M=Al or Y; Li1+xMx(Ga)2-x(BO3)3 with M=Al, Y or a mixture of the two compounds and $0 \leq x \leq 0.8$; Li3BO3, Li3BO3-Li2SO4, Li3BO3-Li2SiO4, Li3BO3-Li2SiO4-Li2SO4;
- the oxynitrides, preferably chosen from Li3PO4-xN2x/3, Li4SiO4-xN2x/3, Li4GeO4-xN2x/3 with $0<x<4$ or Li3BO3-xN2x/3 with $0<x<3$;
- the lithiated compounds containing oxynitride of lithium and of phosphorus, called "LiPON", in the form of LixPOyNz with $x \sim 2.8$ and $2y+3z \sim 7.8$ and $0.16 \leq z \leq 0.4$, and in particular Li2.9PO3.3N0.46, but also the compounds LiwPOxNySz with $2x+3y+2z=5=w$ or the compounds LiwPOxNySz with $3.2 \leq x \leq 3.8$, $0.13 \leq y \leq 0.4$, $0 \leq z \leq 0.2$, $2.9 \leq w \leq 3.3$ or the compounds in the form of LitPxAlyOuNvSw with $5x+3y=5$, $2u+3v+2w=5+t$, $2.9 \leq t \leq 3.3$, $0.84 \leq x \leq 0.94$, $0.094 \leq y \leq 0.26$, $3.2 \leq u \leq 3.8$, $0.13 \leq v \leq 0.46$, $0 \leq w \leq 0.2$;
- the materials containing oxynitrides of lithium of phosphorus or of boron, respectively called "LiPON" and "LiBON" also capable of containing silicon, sulfur, zirconium, aluminum, or a combination of aluminum, boron, sulfur and/or silicon, and boron for the materials containing oxynitrides of lithium of phosphorus;
- the lithiated compounds containing oxynitride of lithium, of phosphorus and of silicon called "LiSiPON", and in particular Li1.9Si0.28P1.0O1.1N1.0;
- the oxynitrides of lithium of the types LiBON, LiBSO, LiSiPON, LiSON, thio-LiSiCON, LiPONB (or B, P and S respectively represent boron, phosphorus and sulfur);
- the oxynitrides of lithium of the type LiBSO such as (1-x)LiBO2-xLi2SO4 with $0.4 \leq x \leq 0.8$;
- the lithiated oxides, preferably chosen from Li7La3Zr2O12 or Li5+xLa3(Zrx,A2-x)O12 with A=Sc, Y, Al, Ga and $1.4 \leq x \leq 2$ or Li0.35La0.55TiO3 or Li3xLa2/3-xTiO3 with $0 \leq x \leq 0.16$ (LLTO);
- the silicates, preferably chosen from Li2Si2O5, Li2SiO3, Li2Si2O6, LiAlSiO4, Li4SiO4, LiAlSi2O6;
- the solid electrolytes of the antiperovskite type chosen from:
  - Li3OA with A a halide or a mixture of halides, preferably at least one of the elements chosen from F, Cl, Br, I or a mixture of two or three or four of these elements;

Li(3-x)Mx/2OA with 0<x≤3, M a divalent metal, preferably at least one of the elements chosen from Mg, Ca, Ba, Sr or a mixture of two or three or four of these elements, A a halide or a mixture of halides, preferably at least one of the elements chosen from F, Cl, Br, I or a mixture of two or three or four of these elements;

Li(3-x)M3x/3OA with 0≤x≤3, M3 a trivalent metal, A a halide or a mixture of halides, preferably at least one of the elements chosen from F, Cl, Br, I or a mixture of two or three or four of these elements; or LiCOXzY(1−z) with X and Y halides as mentioned above in relation to A, and 0≤z≤1;

the compounds La0.51Li0.34Ti2.94, Li3.4V0.4Ge0.6O4, Li2O—Nb2O5, LiAlGaSPO4;

the formulations containing Li2CO3, B2O3, Li2O, Al(PO3)3LiF, P2S3, Li2S, Li3N, Li14Zn(GeO4)4, Li3.6Ge0.6V0.4O4, LiTi2(PO4)3, Li3.25Ge0.25P0.25S4, Li1.3Al0.3Ti1.7(PO4)3, Li1+xAlxM2-x(PO4)3 (where M=Ge, Ti, and/or Hf, and where 0<x<1), Li1+x+yAlxTi2-xSiyP3-yO12 (where 0≤x≤1 and 0≤y≤1);

the electrolytes containing polymers that conduct lithium ions impregnated or not with lithium salts, the hybrid electrolytes comprising an inorganic matrix such as a ceramic matrix into which a phase carrying lithium ions is inserted, such as an organic electrolyte comprising at least one lithium salt, a solution formed by a lithium salt dissolved in an organic solvent or a mixture of organic solvents, and/or comprising a polymer containing at least one lithium salt possibly dissolved in an organic solvent or a mixture of organic solvents, and/or comprising at least one ionic liquid containing at least one lithium salt possibly dissolved in an organic solvent or a mixture of organic solvents.

This phase carrying lithium ions can be a solution formed by a lithium salt dissolved in an organic solvent or a mixture of organic solvents, and/or it can comprise a polymer containing lithium salts, and/or it can comprise an ionic liquid (i.e. a melted lithium salt) containing a lithium salt. This phase can also be a solution formed from a mixture of these three components.

The lithium salt can be for example LiPF6 or LiBF4 dissolved in an aprotic solvent, or an ionic liquid containing lithium salts. The ionic liquids and organic electrolytes can also be mixed. For example the LiPF6 dissolved in EC/DMC can be mixed at 50 mass % with an ionic liquid containing lithium salts of the type LiTFSI:PYR14TFSI 1:9 mol. Mixtures of ionic liquids that can operate at low temperature can also be made, for example such as the mixture LiTFSI: PYR13FSI:PYR14TFSI (2:9:9 mol ratio).

EC is the usual abbreviation for ethylene carbonate (CAS no: 96-49-1). DMC is the usual abbreviation for dimethyl carbonate (CAS no: 616-38-6). LITFSI is the usual abbreviation for lithium bis-trifluoromethanesulfonimide (CAS no: 90076-65-6). PYR13FSI is the usual abbreviation for N-Propyl-N-Methylpyrrolidinium bis(fluorosulfonyl)imide. PYR14TFSI is the usual abbreviation for 1-butyl-1-methylpyrrolidinium bis(trifluoromethanesulfonyl)imide.

Yet another object of the invention is a thin film battery capable of being obtained by the method according to the invention.

Yet another object of the invention is a thin film battery capable of being obtained by the method according to the invention characterized in that said encapsulation system totally coats four of the six faces of said battery and partly coats the two laterally opposite remaining faces, said two remaining faces being partly coated by at least said first covering layer 31,31' and at least said second layer 32,32' and said two remaining faces comprising an anode connection zone and a cathode connection zone.

Another object of the invention is a battery comprising a stack alternating between at least one anode 10' and at least one cathode 20', each consisting of a stack of thin films and wherein the anode 10' comprises:

at least one thin film of an active anode material 12', and optionally a thin film of an electrolyte material 13', and wherein the cathode 20' comprises at least one thin film of an active cathode material 22', and optionally a thin film of an electrolyte material 23' so that that the battery successively comprises at least one thin film of an active anode material, at least one thin film of an electrolyte material and at least one thin film of an active cathode material, with it being understood that the anode 10' has a first orifice 50 having a first cross-section, the wall of said first orifice forming at least one region that is set back RT (respectively protruding RS) and the adjacent cathode 20' has a second orifice having a second cross-section, smaller (respectively greater) than the first cross-section, the wall of said second orifice forming at least one region that is protruding RS (respectively set back RT); said at least one protruding region defining an accessible connection zone ZC and said at least one set-back region RT defining a non-accessible covering zone.

DRAWINGS

FIGS. 1 to 27 illustrate certain aspects of the invention, but do not limit its scope.

FIG. 1 schematically shows, a battery that reveals a central element and interconnections disposed at the two ends of the central element.

Figure 11:
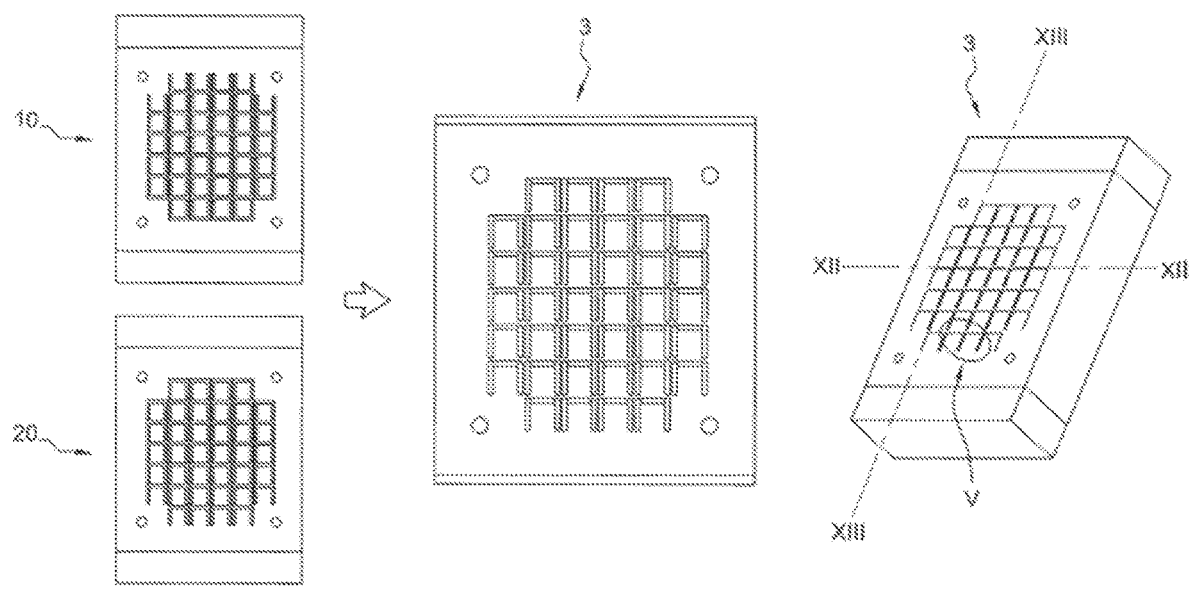

FIG. 11 schematically shows the method for manufacturing a plurality of all-solid batteries from an alternating stack of sheets comprising between several tens of and several hundred anodes defined according to a cutting plane in the shape of a U and of sheets comprising between several tens of and several hundred cathodes defined according to a cutting plane in the shape of a U.

Figure 12:
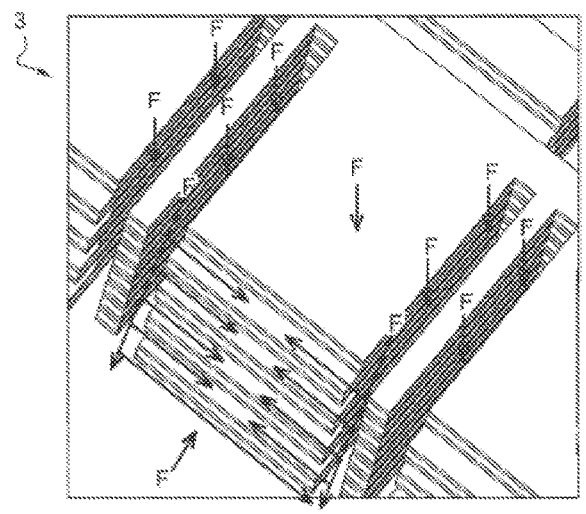

FIG. 12 shows a perspective view with a cut of an all-solid battery, along the line XII-XII of FIG. 11 showing the stack of the sheets of anodes and of cathodes superimposed and offset laterally.

Figure 13:
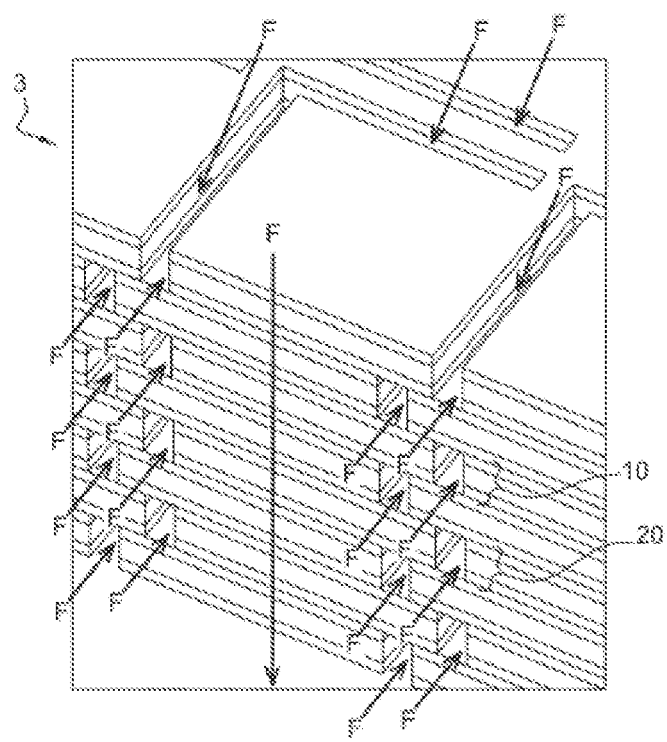

FIG. 13 shows a perspective view with a cut of an all-solid battery, along the line XIII-XIII of FIG. 11 showing the stack of the sheets of anodes and of cathodes superimposed and offset laterally.

Figure 14:
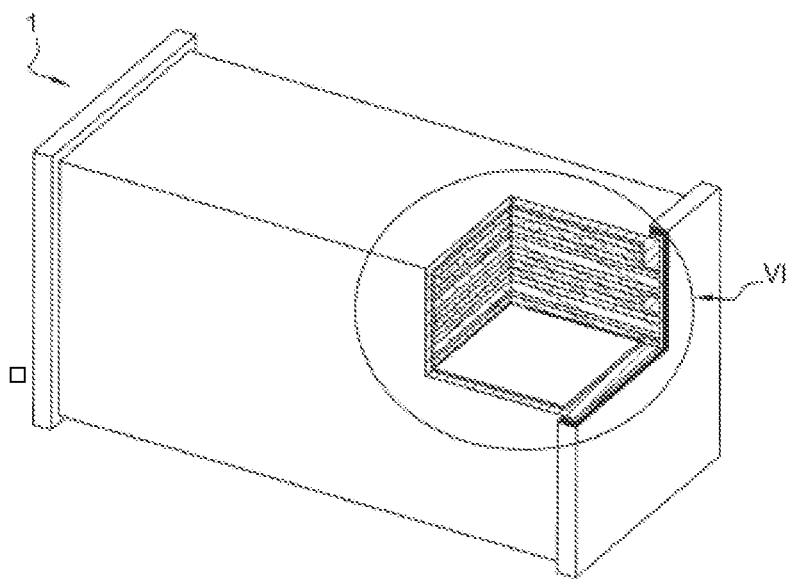

FIG. 14 shows a perspective view with a cut of an all-solid battery showing the stack of the sheets of anodes and of cathodes superimposed and offset laterally, as well as the encapsulation system and the interconnections.

Figure 15:
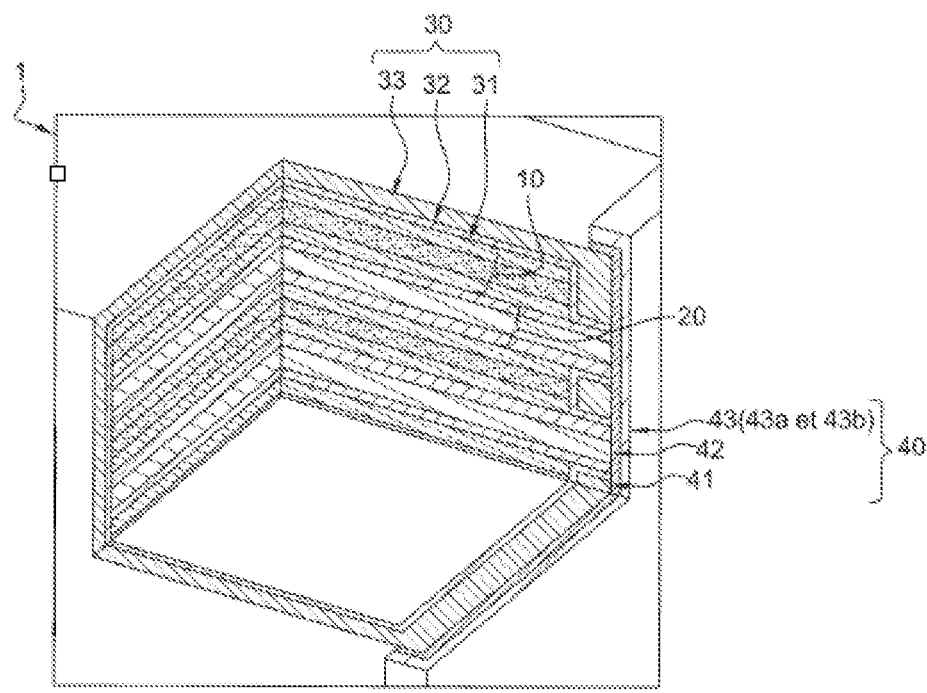

FIG. 15 shows a perspective view with a cut analogous to FIG. 14 illustrating on a greater scale the detail VI of this FIG. 14, illustrating the inner structure of various elements forming an all-solid battery.

Figure 16:
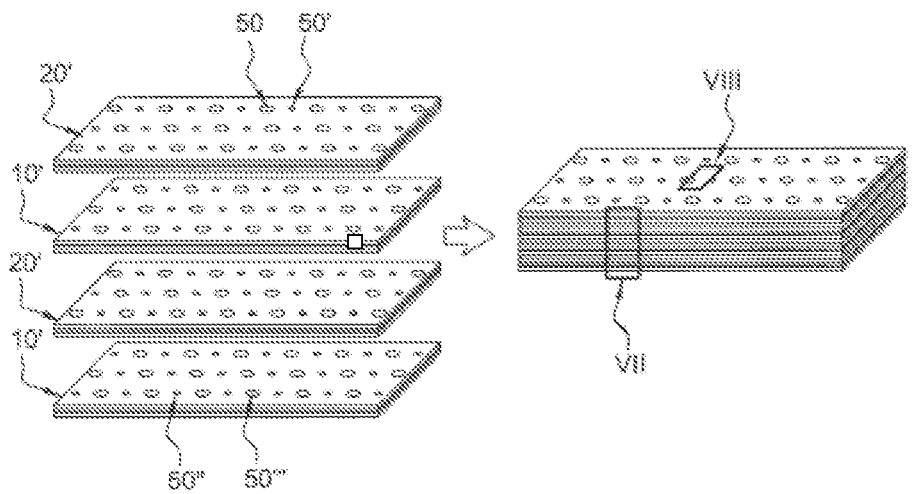

FIG. 16 schematically shows, according to another embodiment, the method for manufacturing a plurality of all-solid batteries.

Figure 17:
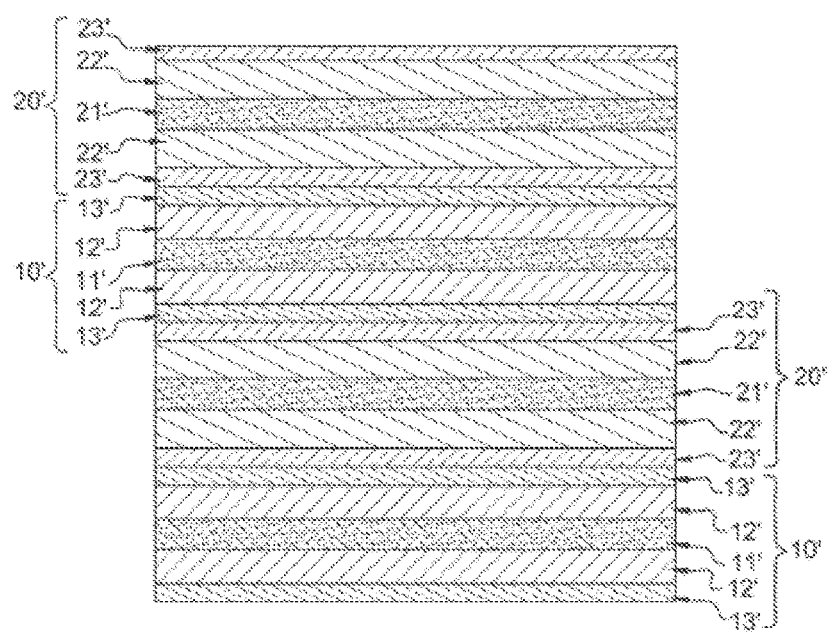

FIG. 17 schematically shows a cross-sectional view illustrating on a greater scale the detail VII of FIG. 16.

Figure 18:
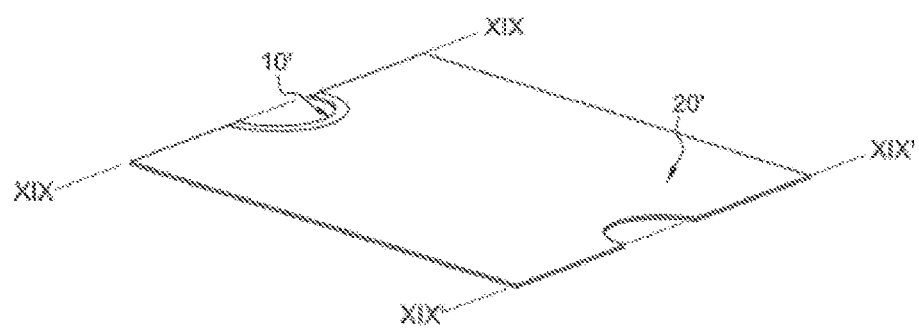

FIG. 18 shows a perspective view analogous to FIG. 16 illustrating on a greater scale the detail VIII of this FIG. 16.

Figure 19A:
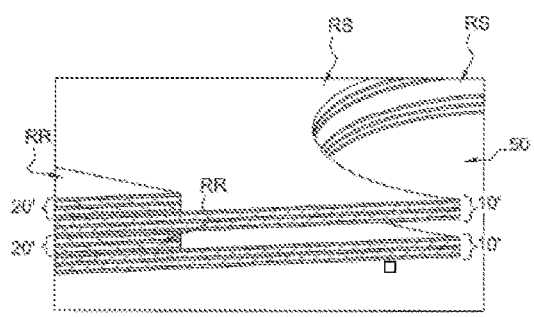
Figure 19B:
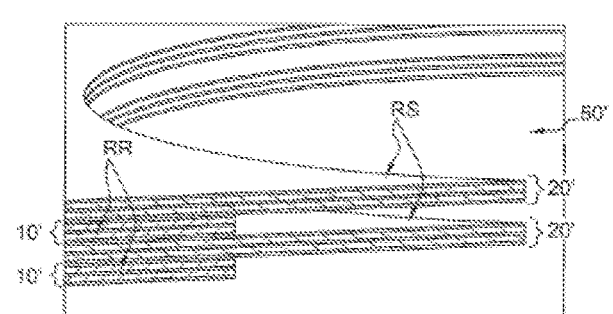

FIG. 19A shows a perspective view with a cut of an all-solid battery, along the line XIX-XIX of FIG. 18. FIG. 19B shows a perspective view with a cut of an all-solid battery, along the line XIX'-XIX' of FIG. 18.

Figure 20:
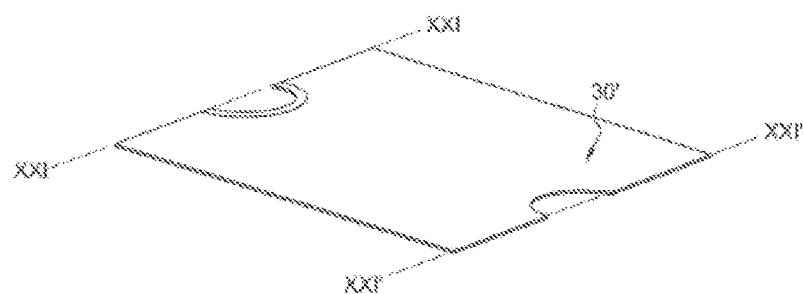

FIG. 20 shows a perspective view of the structure presented in FIG. 18 covered with the encapsulation system.

Figure 21A:
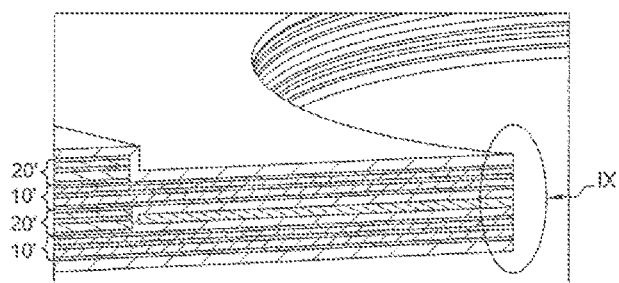
Figure 21B:
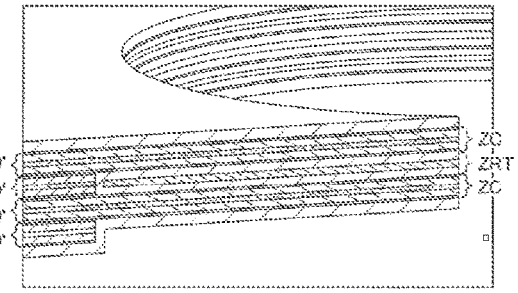

FIG. 21A shows a perspective view with a cut of an all-solid battery, along the line XXI-XXI of FIG. 20. FIG. 21B shows a perspective view with a cut of an all-solid battery, along the line XXI'-XXI' of FIG. 20.

Figure 22:
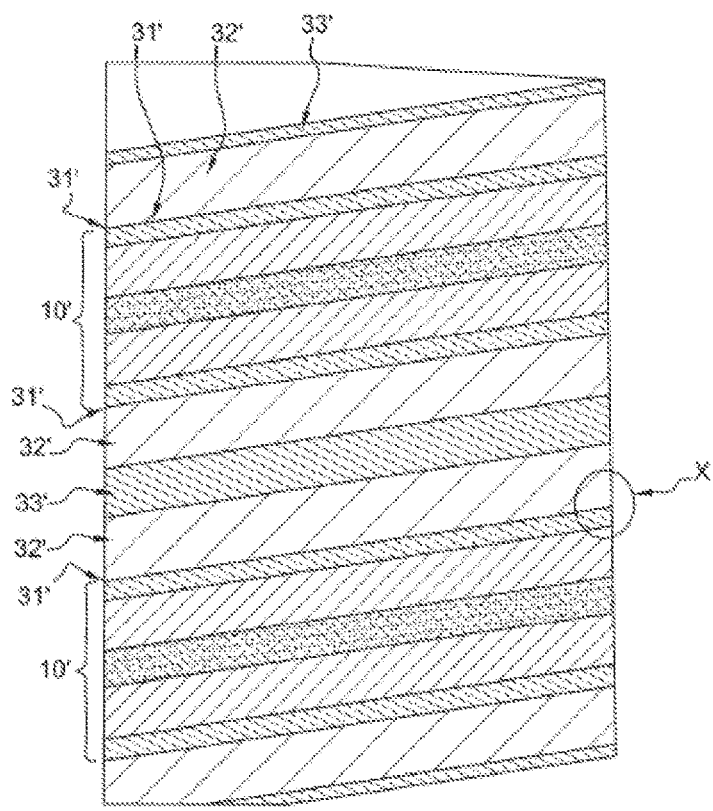

FIG. 22 shows a perspective view analogous to FIG. 21A illustrating on a greater scale the detail IX of this FIG. 21A.

FIG. 23 shows a perspective view analogous to FIG. 22 illustrating on a greater scale the detail X of this FIG. 22.

FIG. 24 shows a perspective view of the structure presented in FIG. 20 and showing the multilayer encapsulation system according to the invention covered with the multilayer system of the interconnections.

FIG. 25A shows a perspective view with a cut of an all-solid battery, along the line XXV-XXV or XXV'-XXV' of FIG. 24 showing the stack of the superimposed sheets of anodes having anode contacts covered laterally by the multilayer system of the interconnections.

FIG. 25B shows a perspective view with a cut of an all-solid battery, along the line XXV-XXV or XXV'-XXV' of FIG. 24 showing the stack of the superimposed sheets of cathodes having cathode contacts covered laterally by the multilayer system of the interconnections.

Figure 26:
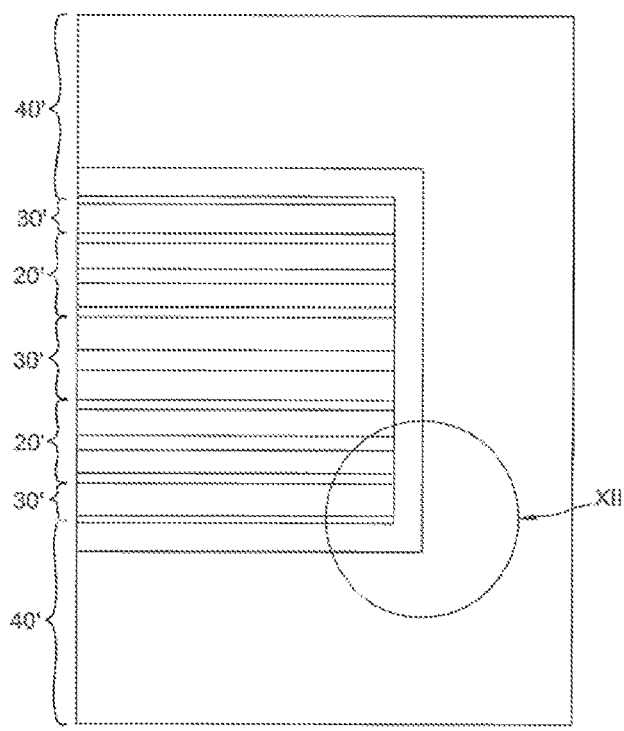

FIG. 26 shows a perspective view analogous to FIG. 25 illustrating on a greater scale the detail XI of this FIG. 25.

Figure 27:
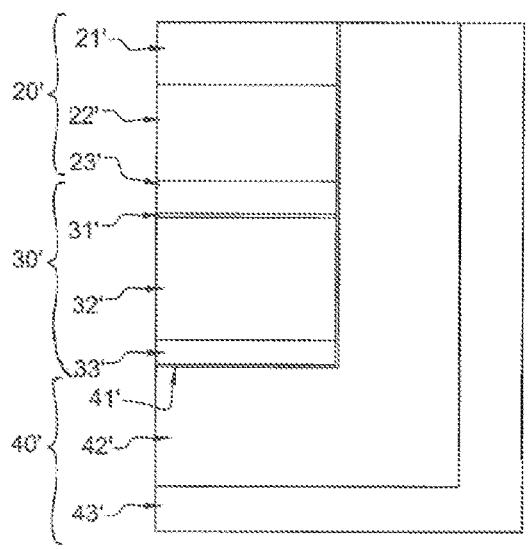

FIG. 27 shows a perspective view analogous to FIG. 26 illustrating on a greater scale the detail XII of this FIG. 26.

Figure 28A:
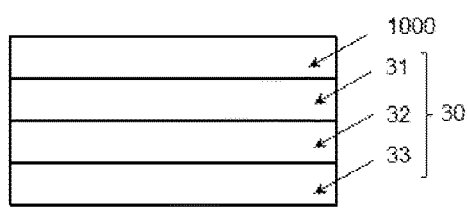
Figure 28B:
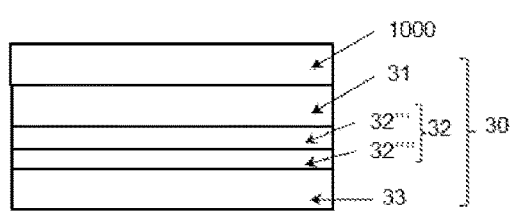

FIGS. 28a and 28b show a cross-sectional view of a portion of the object 1000 such as an electronic or electrochemical component covered by the encapsulation system according to the invention.

FIGS. 29a and 29b show a cross-sectional view of a portion of the object 1000 such as an electronic or electrochemical component covered by the encapsulation system according to the first alternative of the invention.

FIGS. 30a and 30b show a cross-sectional view of a portion of the object 1000 such as an electronic or electrochemical component covered by the encapsulation system according to the second alternative of the invention.

FIGS. 31a and 31b show a cross-sectional view of a portion of the object 1000 such as an electronic or electrochemical component covered by the encapsulation system according to the third alternative of the invention.

Figure 32:
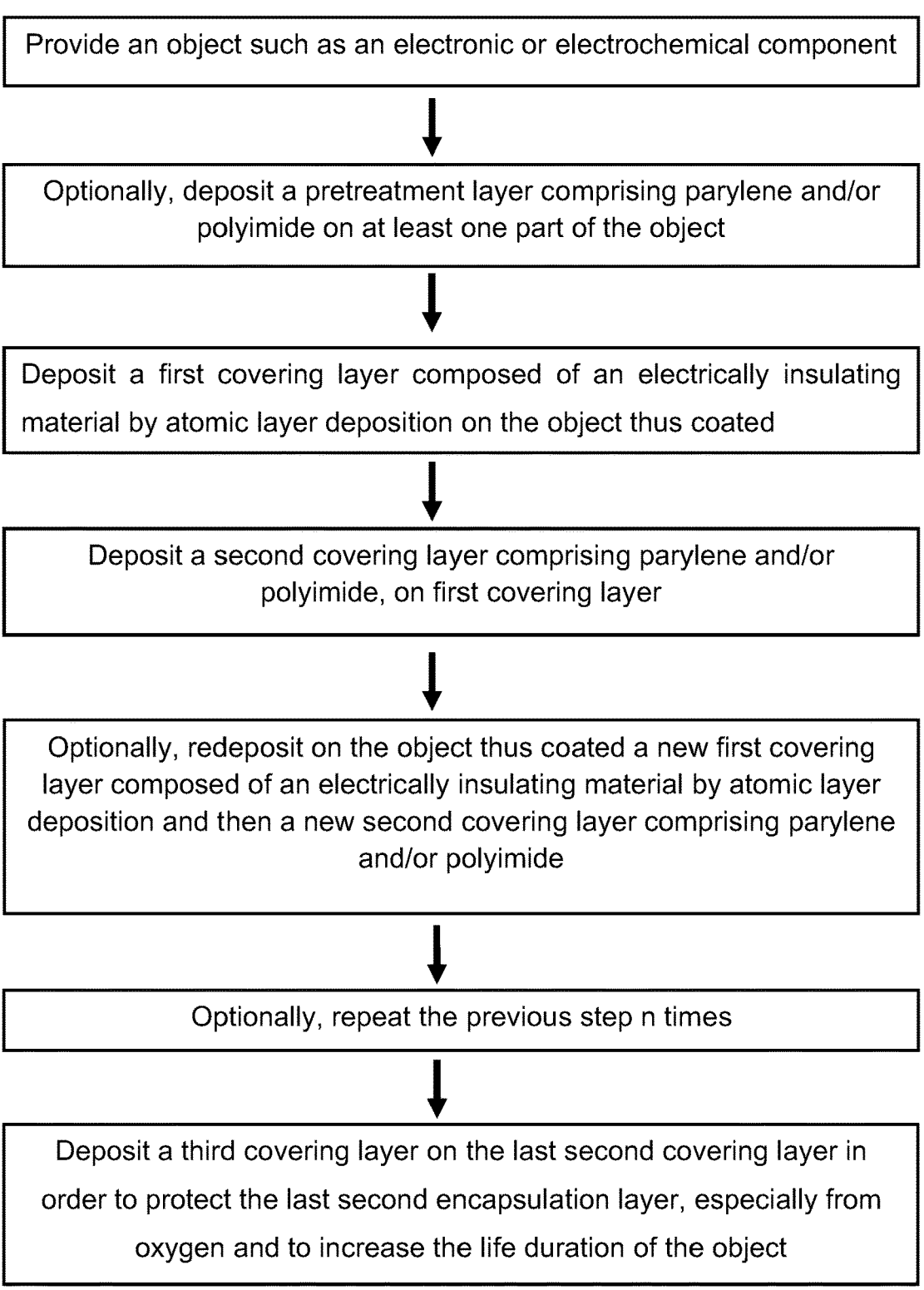

FIG. 32 is a diagram of a method for manufacturing a system for encapsulating an object 1000 according to the invention.

Figure 33:
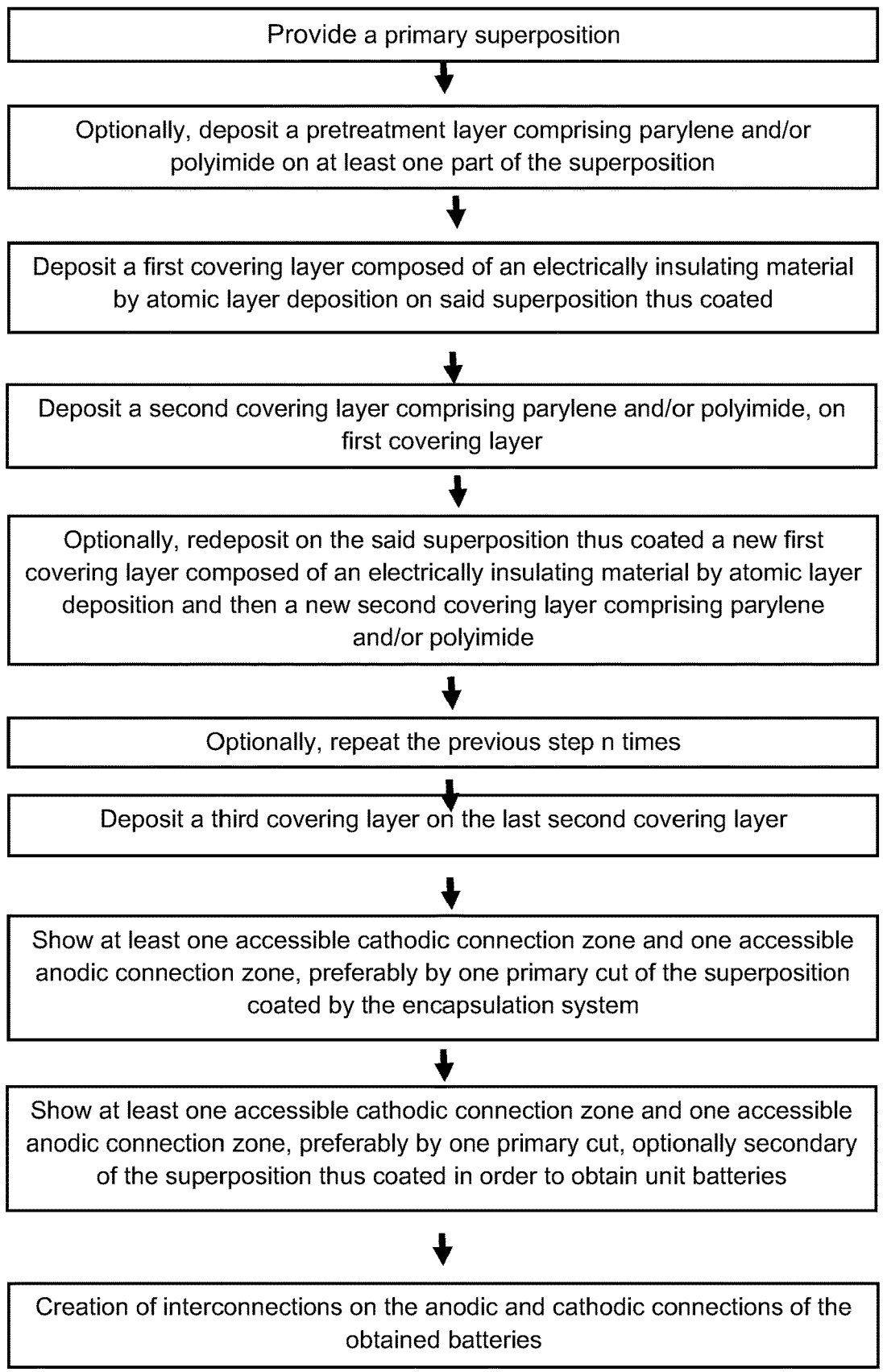

FIG. 33 is a diagram of a method for manufacturing a battery encapsulated by the encapsulation system according to the invention.

DESCRIPTION

The present invention relates to a system for encapsulating an object 1000 providing it with electrical insulation and protecting it from the outside environment, and namely from the ambient atmosphere. The encapsulation system according to the invention allows to offer a protection adapted to the stresses that the electronic components must effectively be able to withstand without notable disturbance of their operation or without damage.

The system for encapsulating an object according to the invention, shown in FIG. 28a, comprises:

i. a first covering layer composed of an electrically insulating material deposited by ALD (Atomic Layer Deposition) intended to at least partly cover said object, ii. a second covering layer comprising parylene and/or polyimide disposed on the first covering layer, iii. a third covering layer deposited on the second covering layer in such a way as to protect the second layer of the encapsulation system, namely from oxygen and to increase the service life of the object.

The encapsulated object can be a component that is electronic (such as an integrated circuit, a resistor, a capacitor), or electrochemical such as a battery, a photovoltaic panel.

The first covering layer 31 of the encapsulation system consists of an electrically insulating material such as Al2O3, SiO2, SiOyNx and the epoxy resins. Advantageously, said electrically insulating material is chosen from organic or inorganic polymer materials having barrier properties with regard to water. This first layer is deposited on at least a portion of said object by a conformal deposition technique, such as an atomic layer deposition method (Atomic Layer Deposition, better known by the acronym ALD). When the object is a battery, the first covering layer 31 is deposited on the stack or the primary superposition by ALD. Thus a conformal covering of all of the accessible surfaces of the stack is obtained; this first layer is preferably an inorganic layer.

The techniques of deposition by ALD are particularly well adapted to covering surfaces having a high roughness in a totally impermeable and conformal manner. The techniques of deposition by ALD allow to make conformal layers, free of defects, of holes. These layers are qualified as "free of holes" (pinhole free) and represent very good barriers. Their WVTR coefficient is extremely low. The WVTR (Water Vapor Transmission Rate) coefficient allows to evaluate the permeance to water vapor of the encapsulation system. The lower the WVTR coefficient, the more impermeable the encapsulation system. For example, a deposit of Al2O3 100 nm thick by ALD has a permeation to water vapor of 0.00034 g/m2.d.

The first encapsulation layer thus obtained can be made of ceramic material, made of glass material or made of glass-ceramic material. It generally consists of oxides, of the type Al2O3, of nitride, of phosphates, of oxynitride, of siloxane, having a thickness of less than 200 nm, preferably between 5 nm and 200 nm, more preferably between 10 nm and 100 nm and even more preferably approximately fifty nanometers. However, these layers deposited by ALD are very mechanically fragile and require a rigid bearing surface. The deposition of a fragile layer on a flexible surface would lead to the formation of cracks, engendering a loss of integrity of this protective layer. Moreover, in order to industrially allow a relatively high rate of deposition, these layers must be deposited at a rather high temperature, i.e. at a temperature between 180° C. and 300° C. The materials forming the object must thus resist such temperatures and have a surface sufficiently rigid to guarantee the creation of a quality encapsulation by ALD. This applies in particular to the rigid stacks, to the one-piece solid stacks of lithium-ion cells, i.e. of lithium-ion battery. However, most of the usual electrolytes containing polymers containing lithium salts, i.e. electrolytes in the form of a gel, liquid or containing pockets of liquid, do not resist such a temperature and do not have a surface sufficiently rigid to guarantee the creation of a reliable encapsulation by ALD. Indeed, under vacuum and at a high temperature, these electrolytes degas and thus prevent the creation of homogenous and protective thin deposits directly on their surfaces. Preferably, the use of these electrolytes in batteries that will use the encapsulation system according to the invention will therefore be avoided.

An exception can be made for the lithium-ion batteries using at least one porous electrode and/or at least one electrolyte comprising a porous inorganic layer, the electrode and the porous inorganic layer having an interconnected network of open pores in which the average diameter D50 of the pores is between 2 nm and 80 nm, preferably between 2 nm and 50 nm, preferably between 6 nm and 30 nm, and even more preferably between 8 nm and 20 nm and the pores of which, because of their size, are capable of absorbing a liquid phase by simple capillarity and are impregnated with a phase carrying lithium ions, i.e. by an electrolyte, such as a solution formed by a lithium salt dissolved in an organic solvent or a mixture of organic solvents, and/or comprising a polymer containing at least one lithium salt possibly dissolved in an organic solvent or a mixture of organic solvents, and/or comprising at least one ionic liquid containing at least one lithium salt possibly dissolved in an organic solvent or a mixture of organic solvents.

The liquid phase "nanoconfined" or "nanotrapped" in the porosities, preferably in the mesoporosities, can no longer come out again. It is bound by a phenomenon called here "absorption in the mesoporous structure" (which does not appear to have been described in the literature in the context of lithium-ion batteries) and can no longer come out even when the cell is placed under vacuum. This battery comprising such a porous electrode and/or such an electrolyte is thus considered to be quasi-solid. Via the nanoconfinement of the conductive phase carrying lithium ions in the porosities, the battery can undergo treatments under vacuum contrary to the lithium-ion batteries that use separators impregnated with usual electrolytes as indicated above; these lithium-ion batteries using separators are not sufficiently rigid to undergo these treatments under vacuum without being degraded.

When the object 1000 is a battery, this first encapsulation layer 31 also allows to separate the sections of the electrodes, in order to reduce the self-discharge and the risks of aging of the battery, which thus facilitates the bringing closer together of the electrodes.

According to the invention, a second encapsulation layer 32 is deposited on the first encapsulation layer in order to improve the protection of the object (i.e. electronic or electrochemical component such as a battery) from its outside environment. Typically, this second layer is made of polymer, for example made of silicone (deposited for example by impregnation or by plasma-assisted chemical vapor deposition using hexamethyldisiloxane (HMDSO)), or made of epoxy resin, or made of polyimide, or made of parylene, preferably made of parylene and/or made of polyimide. This second encapsulation layer is advantageously obtained from the condensation of gaseous monomers deposited by chemical vapor deposition (CVD) on the surfaces, which allows to have a conformal and uniform covering of all of the surfaces of the accessible object.

This second layer ensures the filling of the encapsulation system without degrading the first layer of the encapsulation system. It allows to follow the variations in volume of the object during its operation and facilitates the cutting itself of the batteries via its elastic properties. The thickness of said second encapsulation layer is between 1 μm and 50 μm, preferably between 1 μm and 35 μm, preferably between 2 μm and 10 μm, preferably between 2 μm and 5 μm and even more preferably approximately 3 μm.

Advantageously, on the first covering layer 31, a parylene film is deposited, such as a film of parylene C, of parylene D, a film of parylene N (CAS 1633-22-3) or a film comprising a mixture of parylene C, D, and/or N. This film of parylene allows to protect the sensitive elements of the object from their environment. Parylene (also called polyparaxylylene or poly(p-xylylene)) is a dielectric, transparent, semi-crystalline material that has high thermodynamic stability, excellent resistance to solvents and a very low permeability. Parylene also has barrier properties allowing to protect the object from its outside environment. The protection of the battery is increased when this second encapsulation layer is made from parylene N.

Alternatively, a layer containing polyimide is deposited on the first covering layer. This layer of polyimide protects the sensitive elements of the battery from their environment.

In an alternative and particularly advantageous manner, the second encapsulation layer 32 (i.e. second covering layer) consists of a first layer of polyimide 32''' deposited on the first covering layer, preferably approximately 1 μm thick on which a second layer of parylene 32'''' is deposited, preferably approximately 2 μm thick. This protection is increased when this second layer of parylene, preferably approximately 2 μm thick is made from parylene N. The layer of polyimide associated with the layer of parylene improves the protection of the sensitive elements of the battery from their environment (cf. FIG. 28b). However, the inventors have observed that this second covering layer deposited on the first encapsulation layer, namely when it is made from parylene, does not have sufficient stability in the presence of oxygen. When this second layer is made from polyimide, it does not have sufficient impermeability, namely in the presence of water. According to the invention, it is coated with a third layer, which protects it from the air and improves the service life of the electronic or electrochemical component (in this case of the battery).

Advantageously, this third barrier layer 33 is also chosen in order to resist a high temperature, and has a mechanical strength sufficient to protect it during the later use of the object. Advantageously, the thickness of the third covering thin film is between 1 µm and 50 µm. Ideally, the thickness of the third covering thin film is approximately 10-15 µm, such a range of thickness allows to protect the battery against mechanical damage. The thickness of the third thin film can be, preferably, less than 10 µm, preferably less than 5 µm and even more preferably approximately 2 µm.

This third layer 33 preferably contains epoxy resin, polyethylene naphthalate (PEN), polyimide, polyamide, polyurethane or silicone. Advantageously the materials used to make this third layer are chosen in order to facilitate the assembly of the electronic or electrochemical component. Advantageously, this third layer is deposited via dipping.

Below, three alternatives of the encapsulation system according to the invention will be described. Then, two embodiments, each of which can be combined with the invention or with any one of the three alternatives of the invention, will be described.

First Alternative of the Invention

According to an advantageous alternative of the invention that is implemented indifferently with one or the other of the embodiments described below, a pretreatment of the object is carried out before its encapsulation by the encapsulation system according to the invention (cf. FIG. 29a). This pretreatment of the object 1000 involves covering it with a polymer layer, preferably containing polyimide and/or parylene, preferably parylene, namely parylene N in order to improve the protection of the object. This pretreatment layer 50 is a covering layer. This pretreatment layer 50 is advantageously used to protect lithium-ion batteries using at least one porous electrode and/or at least one electrolyte comprising a porous inorganic layer as indicated above and where the electrode and the porous inorganic layer have an interconnected network of open pores in which the average diameter D50 of the pores is between 2 nm and 80 nm, preferably between 2 nm and 50 nm, preferably between 6 nm and 30 nm, and even more preferably between 8 nm and 20 nm and the pores of which are impregnated with a phase carrying lithium ions, preferably by an ionic liquid "nanoconfined" or "nanotrapped" in the porosities. This pretreatment layer 50 on this type of lithium-ion battery prevents the possible degassing of the electrolytes during any manipulation of said battery, namely under vacuum and at high temperature.

This pretreatment layer 50 allows to carry out high-performance encapsulations on lithium-ion batteries using at least one porous electrode and/or at least one electrolyte comprising a porous inorganic layer as indicated above, preferably impregnated by a "nanoconfined" ionic liquid.

It can be deposited under vacuum, by a technique of chemical vapor deposition (CVD). This pretreatment layer 50 is advantageously obtained using the condensation of gaseous monomers deposited by a technique of chemical vapor deposition (CVD) on the surfaces, which allows to have a conformal and uniform covering of all of the accessible surfaces of the stack. It allows to follow the variations in volume of the object such as a battery during its operation and facilitates the cutting itself of the batteries via its elastic properties. Preferably, the thickness of this pretreatment layer is between 1 µm and 50 µm, preferably between 2 µm and 10 µm, preferably between 2 µm and 5 µm and even more preferably approximately 3 µm. It allows to cover all of the accessible surfaces of the stack, to close all of the pores of these accessible surfaces and to make the chemical nature of the substrate uniform. The encapsulation can thus be carried out directly on the stacks, the coating being able to penetrate into all of the available cavities.

Advantageously, a layer of parylene is deposited as the pretreatment layer 50, such as a layer of parylene C, of parylene D, a layer of parylene N (CAS 1633-22-3) or a layer comprising a mixture of parylene C, D, and/or N on the object. Parylene (also called polyparaxylylene or poly(p-xylylene)) is a dielectric, transparent, semi-crystalline material that has high thermodynamic stability, excellent resistance to solvents and a very low permeability. Via its properties, namely its barrier properties with regard to water, the parylene contributes to the insulation of the object from its outside environment. This layer of parylene protects the sensitive elements of the battery from their environment. This protection is increased when this pretreatment layer is made from parylene N. Alternatively, a pretreatment layer containing polyimide is deposited. This layer of polyimide protects the sensitive elements of the battery from their environment.

In an alternative and particularly advantageous manner, the pretreatment layer 50 consists of a first layer of polyimide 50a, preferably approximately 1 µm thick on which a second layer of parylene 50b is deposited, preferably approximately 2 µm thick (cf. FIG. 29b). This protection is increased when this second layer of parylene 50b, preferably approximately 2 µm thick is made from parylene N. The layer of polyimide 50a associated with the layer of parylene 50b improves the protection of the sensitive elements of the battery from their environment.

However, the inventors have observed that this pretreatment layer 50, when it is made from parylene, does not have sufficient stability in the presence of oxygen. When this pretreatment layer is made from polyimide, it does not have sufficient impermeability, namely in the presence of water. For these reasons the first layer of the encapsulation system 31 is deposited on this pretreatment layer 50 in such a way that the first encapsulation layer 31 coats the pretreatment layer 50. The pretreatment layer 50 is disposed between the object 1000 and the first layer of the encapsulation system 31 according to the invention.

Advantageously, the first encapsulation layer 31 composed of an electrically insulating material, preferably inorganic, is deposited by a technique of conformal deposition, such as atomic layer deposition (ALD) on the pretreatment layer. Thus conformal covering of all of the accessible surfaces of the stack previously covered with the pretreatment layer is obtained; the first layer is preferably an inorganic layer. The growth of the layer deposited by ALD is influenced by the nature of the substrate. A layer deposited by ALD on a substrate having various zones of different chemical natures will have a non-homogenous growth, which can engender a loss of integrity of this protective layer.

The techniques of deposition by ALD are particularly well adapted to covering surfaces having a high roughness in a totally impermeable and conformal manner. They allow to make conformal layers, free of defects, such as holes (layers called "pinhole free", free of holes) and represent very good barriers. Their WVTR coefficient is extremely low. The WVTR (water vapor transmission rate) coefficient allows to evaluate the permeance to water vapor of the encapsulation system. The lower the WVTR coefficient, the more impermeable the encapsulation system.

The first layer 31 can be made of ceramic material, made of glass material or made of glass-ceramic material, for example in the form of oxide, of the type $Al_2O_3$, of nitride, of phosphates, of oxynitride, or of siloxane. This first encapsulation layer 31 has a thickness of less than 200 nm, preferably between 5 nm and 200 nm, more preferably between 10 nm and 100 nm and even more preferably approximately fifty nanometers. It is preferred to deposit it by a technique of conformal deposition, such as by atomic layer deposition (ALD).

This first layer 31 deposited by ALD on the polymer pretreatment layer 50 allows on the one hand, to ensure the impermeability of the structure, i.e. to prevent the migration of the water inside the object and on the other hand to protect the pretreatment layer 50, preferably of parylene and/or of polyimide from the atmosphere, namely from air and from humidity, from heat exposures in order to avoid its degradation. This first layer 31 improves the service life of the encapsulated battery.

However, the layers deposited by ALD are very mechanically fragile and require a rigid bearing surface in order to ensure their protective role. The deposition of a fragile layer on a flexible surface would lead to the formation of cracks, engendering a loss of integrity of this protective layer.

Advantageously, a second encapsulation layer 32 is deposited on the first encapsulation layer 31 in order to increase the protection of the battery cells from their outside environment. Typically, this second layer 32 is made of polymer, for example made of silicone (deposited for example by impregnation or by plasma-assisted chemical vapor deposition using hexamethyldisiloxane (HMDSO)), or made of epoxy resin, or made of parylene, or made of polyimide, preferably made of parylene and/or made of polyimide as indicated above. According to the first alternative of the invention, the second encapsulation layer 32 is coated with a third layer 33, which protects it from the air and improves the service life of the object (in this case of the battery). Advantageously this third barrier layer 33 is also chosen in order to resist a high temperature, and has a mechanical strength sufficient to protect it during the later use of the object. Advantageously, the thickness of the third covering thin film is between 1 μm and 50 μm. Ideally, the thickness of the third covering thin film is approximately 10-15 μm, such a range of thickness allows to protect the battery against mechanical damage. The thickness of the third thin film 33 can be, preferably less than 10 μm, preferably less than 5 μm and even more preferably approximately 2 μm.

This third layer 33 preferably contains epoxy resin, polyethylene naphthalate (PEN), polyimide, polyamide, polyurethane or silicone. Advantageously the materials used to make this third layer are chosen in order to facilitate the assembly of the electronic or electrochemical component. Advantageously, this third layer 33 is deposited via dipping.

Second Alternative of the Invention

This second advantageous alternative of the invention can be implemented indifferently with one or the other of the embodiments described below.

According to a second alternative of the invention, the object can be encapsulated by an alternating succession of layers of parylene and/or of polyimide, having a thickness preferably between 2 μm and 10 μm, preferably between 2 μm and 5 μm and even more preferably approximately 3 μm, and of layers composed of an electrically insulating material having a thickness between 10 nm and 100 nm, preferably of approximately 50 nm, such as inorganic layers deposited conformally, preferably by ALD, as described above in order to create a multilayer encapsulation system.

In order to improve the performance of the encapsulation, a pretreatment of the object can be carried out before its encapsulation by the encapsulation system according to the invention. This pretreatment of the object involves covering the object with a polymer layer (pretreatment layer 50), preferably containing polyimide and/or parylene, preferably parylene, namely parylene N in order to improve the protection of the object as indicated in the first alternative.

Advantageously, a layer of parylene can be deposited as the pretreatment layer 50, such as a layer of parylene C, of parylene D, a layer of parylene N (CAS 1633-22-3) or a layer comprising a mixture of parylene C, D, and/or N on the object. Via its properties, namely its barrier properties with regard to water, the parylene contributes to the insulation of the object from its outside environment. This layer of parylene protects the sensitive elements of the battery from their environment. This protection is increased when this pretreatment layer 50 is made from parylene N.

Alternatively, a pretreatment layer 50 containing polyimide can be deposited. This layer of polyimide protects the sensitive elements of the battery from their environment.

In an alternative and particularly advantageous manner, the pretreatment layer 50 consists of a first layer of polyimide 50a, preferably approximately 1 μm thick on which a second layer of parylene 50b is deposited, preferably approximately 2 μm thick. This protection is increased when this second layer of parylene, preferably approximately 2 μm thick is made from parylene N. The layer of polyimide associated with the layer of parylene improves the protection of the sensitive elements of the battery from their environment.

The object thus covered by this pretreatment layer 50 is then covered by an alternating succession of at least one first layer 31a composed of an electrically insulating material, preferably an inorganic layer, preferably having a thickness between 10 nm and 100 nm, preferably of approximately 50 nm, deposited conformally by ALD and of at least one second layer of the encapsulation system 32a according to the invention, preferably containing parylene and/or polyimide, preferably approximately 3 μm thick deposited on at least the first layer 31a.

Advantageously, a third encapsulation layer 33 is deposited on this alternating succession of at least one first layer 31a, 31b, 31n and of at least one second layer 32a, 32b, 32n of the encapsulation system according to the invention, in such a way that the object is encapsulated in the encapsulation system 30 according to the invention comprising the three successive layers mentioned above (cf. FIGS. 30a and 30b). Advantageously, the third encapsulation layer 33 allows to increase the protection of the battery cells from their outside environment and to protect them against mechanical damage. This third and last encapsulation layer 33 has a thickness of approximately 10-15 μm. Typically, this third and last layer is made of polymer, for example made of silicone (deposited for example by dipping or by plasma-assisted chemical vapor deposition using hexamethyldisiloxane (HMDSO)), or made of epoxy resin, or made of parylene, or made of polyimide. For example, a layer of silicone (typical thickness approximately 15 μm) can be deposited by injection in order to protect the battery against mechanical damage. The choice of such a material comes from the fact that it resists high temperatures and the battery can thus be easily assembled by welding on electronic cards without the appearance of glass transitions.

Third Alternative of the Invention

This third advantageous alternative of the invention can be implemented indifferently with one or the other of the embodiments described below.

Advantageously, the object is covered by a pretreatment layer 50 as indicated above, and is then covered by an alternating succession of a first layer 31a composed of an electrically insulating material, preferably an inorganic layer, preferably having a thickness between 10 nm and 100 nm, preferably of approximately 50 nm, deposited conformally by ALD, then of a second layer 32a, preferably containing parylene and/or polyimide as indicated above in the context of the previous alternatives, preferably approximately 3 μm thick deposited on at least the first layer, then of a new first layer 31b composed of an electrically insulating material, preferably an inorganic layer, preferably having a thickness between 10 nm and 100 nm, preferably of approximately 50 nm, deposited conformally by ALD on the second layer 32a, and then of a new second layer 32b, preferably containing parylene and/or polyimide, preferably approximately 3 μm thick deposited on at least the new first layer 31b. The object thus covered is then coated by a last layer corresponding to the third layer of the encapsulation system 33 according to the invention (cf. FIGS. 31a and 31b). Typically, this third and last layer is made of polymer, for example made of silicone (deposited for example by dipping or by plasma-assisted chemical vapor deposition using hexamethyldisiloxane (HMDSO)), or made of epoxy resin, or made of polyimide, or made of parylene. Advantageously, the thickness of the third layer of the encapsulation system 33 is between 1 μm and 50 μm. Ideally, the thickness of the third covering thin film 33 is approximately 10-15 μm, such a range of thickness allows to protect the battery against mechanical damage. The thickness of the third thin film 33 can be, preferably, less than 10 μm, preferably less than 5 μm and even more preferably approximately 2 μm especially when it is desired to minimize the size of the battery and to preserve good protection of the battery against mechanical damage. This succession of layers allows to notably increase the protection of the object while preserving a relatively small thickness.

Primary Superposition of Sheets of Anode and of Sheets of Cathode/Stack of Anode and of Cathode Advantageously, the object protected by the encapsulation system according to the invention is a battery and preferably an all-solid or quasi-solid battery as indicated below.

In the present description, "all-solid" battery means a battery comprising at least a cathode thin film, an anode thin film and a thin film of solid electrolyte, each of the thin films having a very small number of pores.

In the present application, an elementary cell of a battery, preferably an all-solid battery comprises, in an alternating manner, an anode and a cathode, each optionally consisting of a stack of thin films. The anode comprises at least one thin film of an active anode material and optionally a thin film of an electrolyte material. The cathode comprises at least one thin film of an active cathode material and optionally a thin film of an electrolyte material so that the elementary cell of a battery, preferably an all-solid battery successively comprises at least one thin film of an active anode material, at least one thin film of an electrolyte material and at least one thin film of an active cathode material.

When the battery is obtained from an alternating succession of at least one anode and of at least one cathode, the anode advantageously comprises, successively:
  optionally a thin film of an electrolyte material,
  a thin film of an active anode material,
  a metallic thin film,
  a thin film of an active anode material, and
  optionally, a thin film of an electrolyte material.

In the present application, the term "sheet of anode" will be used to designate this layer succession usable in order to create a primary superposition from which at least one unit battery will be later obtained, preferably a plurality of unit batteries.

Likewise, the cathode advantageously and successively comprises:
  optionally a thin film of an electrolyte material,
  a thin film of an active cathode material,
  a metallic thin film,
  a thin film of an active cathode material, and
  optionally, a thin film of an electrolyte material,
so that a battery, preferably an all-solid battery successively comprises at least one thin film of an active anode material, at least one thin film of an electrolyte material and at least one thin film of an active cathode material.

In the context of the present invention the thickness of each of the thin films present in the battery, is less than 10 μm and preferably less than 5 μm.

In the present application, the term "sheet of cathode" will be used to designate this succession of layers usable in order to create a primary superposition. The primary superposition comprises an alternating succession of sheets of cathode and of sheets of anode, from which at least one unit battery comprising a stack of at least one anode and of at least one cathode will be later obtained, preferably a plurality of unit batteries. Two adjacent sheets of this primary superposition define at least one protruding region, intended to form an accessible connection zone, as well as at least one set-back region, intended to form a covering zone, i.e. a zone covered by the encapsulation system or by one of the three alternatives of the encapsulation system. These protruding and set-back regions will be explained in greater detail with regard to two embodiments, which do not limit the invention.

The present invention relates in particular to the encapsulation of all-solid lithium-ion batteries. The present invention also relates to the encapsulation of the lithium-ion batteries using at least one porous electrode and/or at least one electrolyte comprising a porous inorganic layer, the electrode and the porous inorganic layer having an interconnected network of open pores in which the average diameter D50 of the pores is between 2 nm and 80 nm, preferably between 2 nm and 50 nm, preferably between 6 nm and 30 nm, and even more preferably between 8 nm and 20 nm and the pores of which, because of their size, are capable of absorbing a liquid phase by simple capillarity and are impregnated with a phase carrying lithium ions, i.e. by an electrolyte, such as a solution formed by a lithium salt dissolved in an organic solvent or a mixture of organic solvents, and/or comprising a polymer containing at least one lithium salt possibly dissolved in an organic solvent or a mixture of organic solvents, and/or comprising at least one ionic liquid containing at least one lithium salt possibly dissolved in an organic solvent or a mixture of organic solvents. The liquid phase "nanoconfined" or "nanotrapped" in the porosities, preferably in the mesoporosities, can no longer come out again. This battery comprising such a porous electrode and/or such an electrolyte is thus considered to be quasi-solid. According to the invention, the encapsulation system according to the invention cannot be used on lithium-ion batteries using separators since they are not sufficiently rigid to undergo treatments under vacuum without being degraded.

Figure 1:
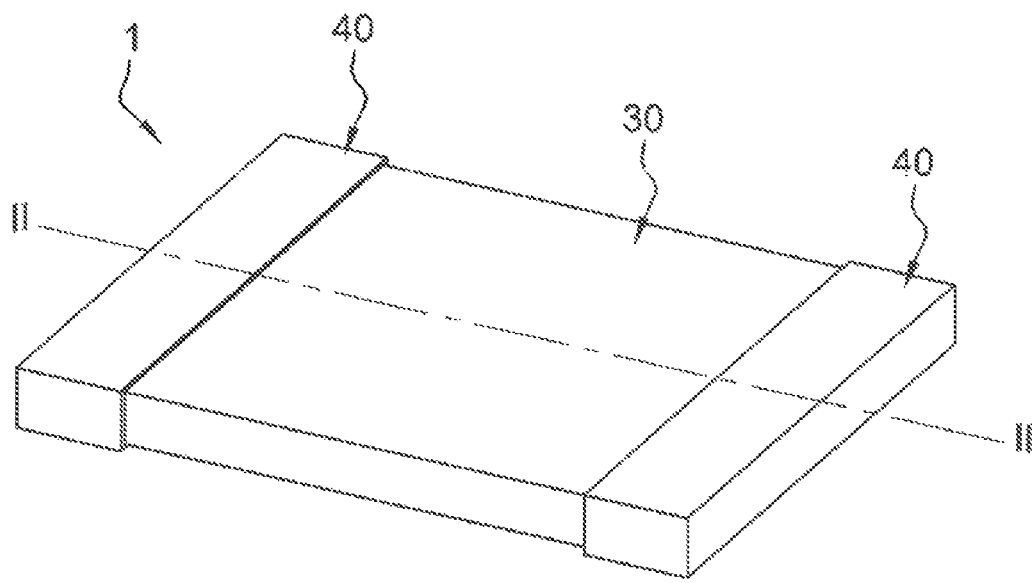
Figure 2:
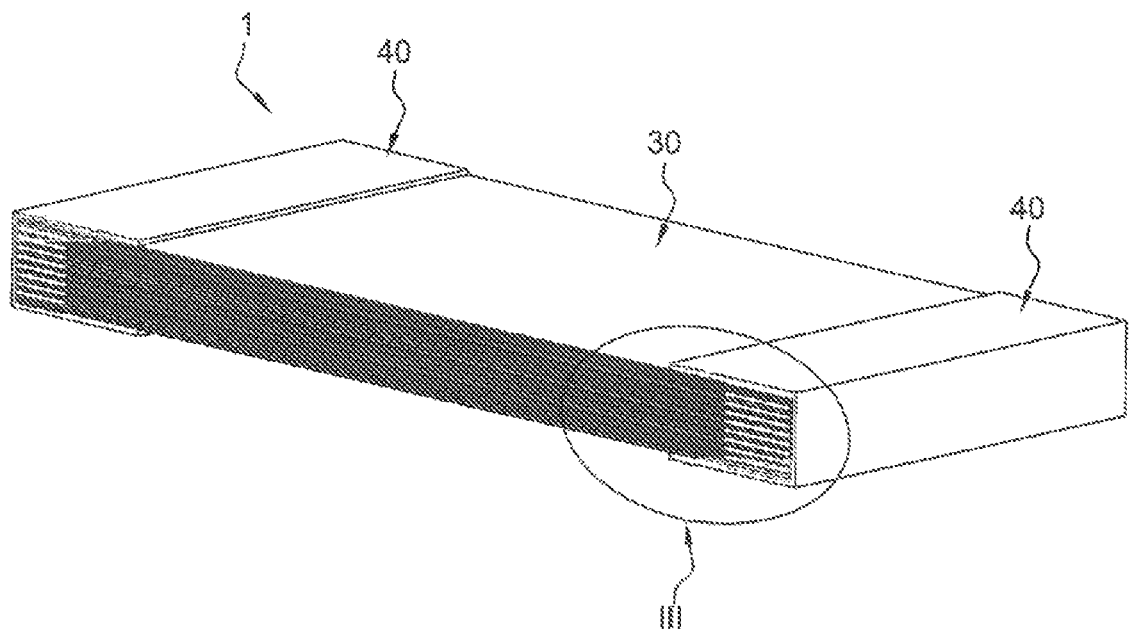
FIG. 2 shows a perspective view with a cut along the line II-II of an entirely solid battery, revealing the inner structure of the central element comprising an assembly of elementary cells covered by an encapsulation system according to the invention and that of the interconnections.
Figure 3:
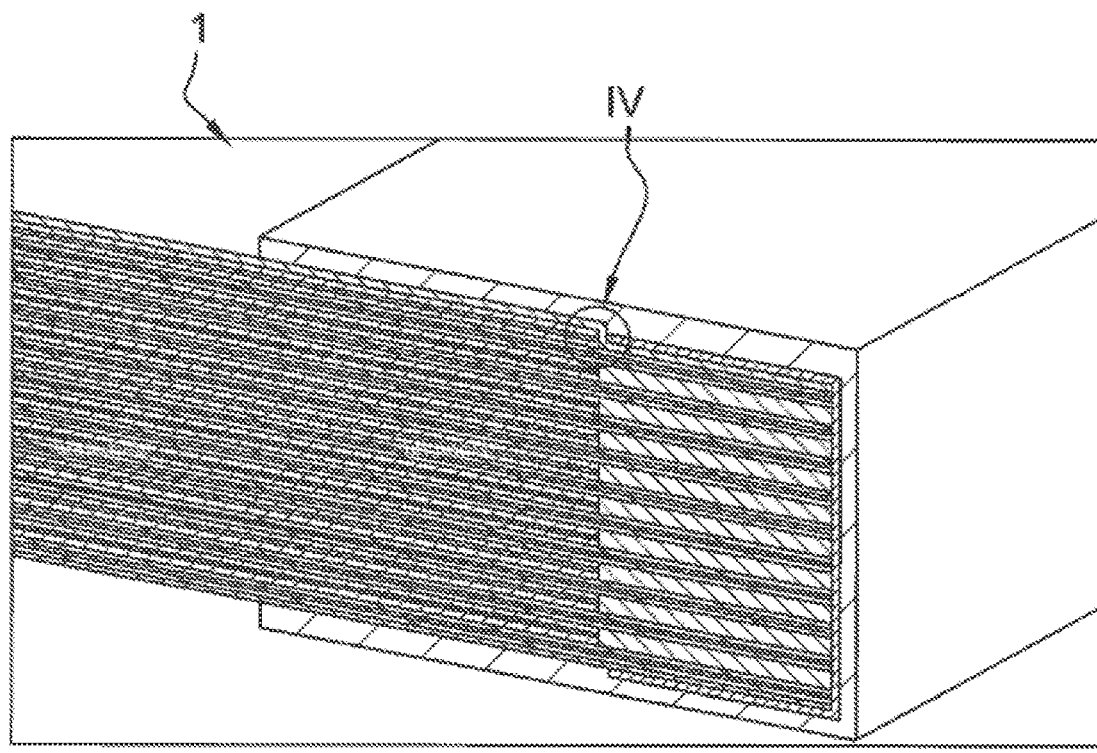
FIG. 3 is a perspective view with a cut analogous to FIG. 2 illustrating on a greater scale the detail III of this FIG. 2. The elements forming the elementary cells, the encapsulation system and the interconnections are presented in greater detail in FIGS. 4, 5 and 6, respectively.
Figure 4:
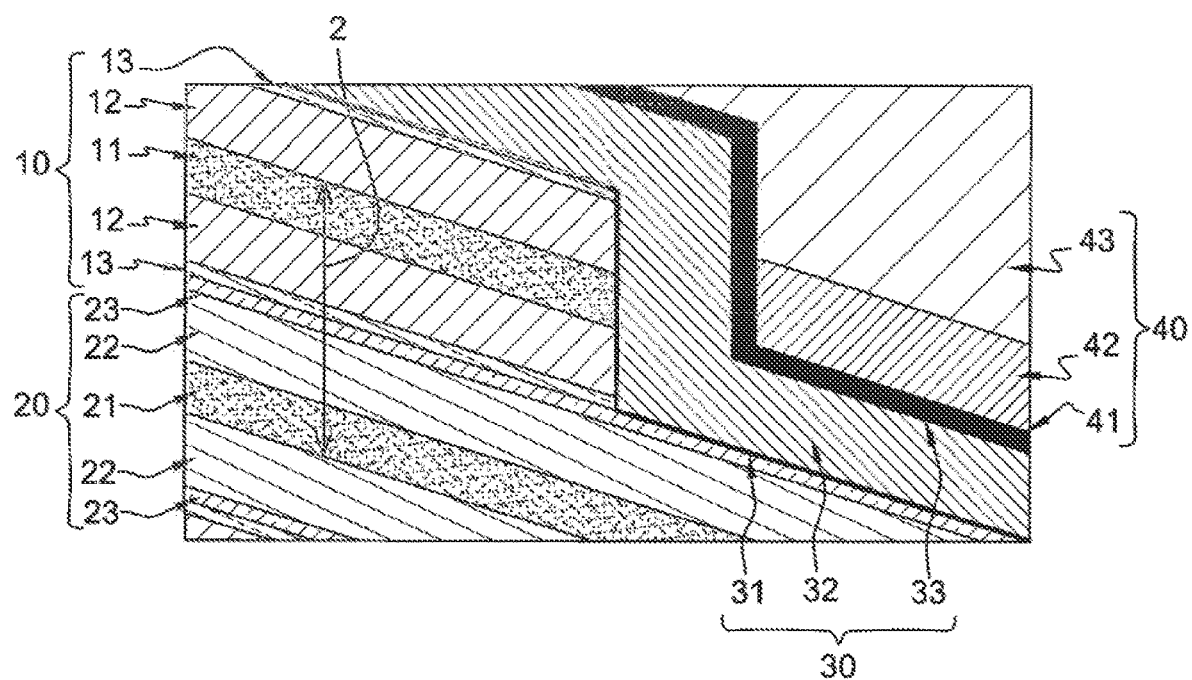
FIG. 4 is a perspective view with a cut analogous to FIG. 3 illustrating on a greater scale the detail IV of this FIG. 3, illustrating the inner structure of various elements forming an all-solid battery.
Figure 5:
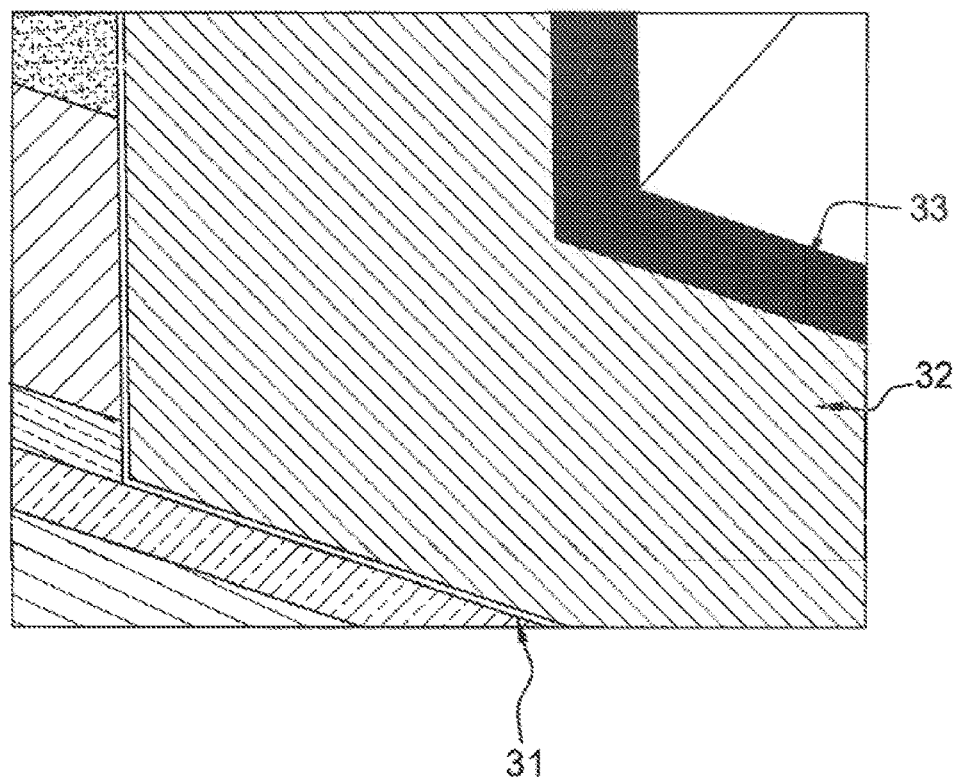
FIG. 5 is a perspective view with a cut analogous to FIG. 4 illustrating on a greater scale the inner structure of the encapsulation system according to the invention.

The all-solid batteries 1 have a rigid one-piece structure on which an encapsulation system 30 can be deposited (cf. FIG. 1). FIG. 3, just like FIG. 2, is a perspective view with a cut of an all-solid battery 1. It reveals the inner structure of the central element comprising an assembly of elementary cells 2 covered by an encapsulation system 30 according to the invention and interconnections 40. FIG. 4 shows in greater detail an all-solid battery comprising an anode 10 and a cathode 20, each consisting of a stack of thin films. The anode successively comprises a thin film of an electrolyte material 13, a thin film of an active anode material 12 such as $Li_4Ti_5O_{12}$, a metallic thin film 11 (for example made of stainless steel), a thin film of an active anode material such as $Li_4Ti_5O_{12}$ 12 and a thin film of an electrolyte material 13.

The cathode 20 successively comprises a thin film of an electrolyte material 23, a thin film of an active cathode material 22 such as $LiMn_2O_4$, a metallic thin film 21 (for example made of stainless steel), a thin film of an active cathode material 22 such as $LiMn_2O_4$) and a thin film of an electrolyte material 23, with it being understood that the battery comprises an alternating succession of at least one anode 10 and of at least one cathode 20, two adjacent sheets of which define at least one protruding region, intended to form an accessible connection zone and at least one set-back region, intended to form a covering zone, i.e. zone covered by the encapsulation system.

This battery consists of an assembly of a plurality of elementary cells connected in parallel, is formed from thin films of anode and of cathode made preferably from materials that are dimensionally stable during the steps of charge and discharge of the battery.

The active anode materials that can be used to carry out such a function include insertion materials of the type $Li_4Ti_5O_{12}$, certain of the nitrides of the type $Li_{3-x}M_xN$ in a limited range of lithium insertion, as well as other anodes of the type $Li_ySiTON$ or $Sn_3N_4$.

The lithium-insertion materials used to make the cathodes are often much more dimensionally stable than the anode materials. The oxides with a spinel structure such as $LiMn_2O_4$, $LiMn_{1.5}Ni_{0.5}O_4$, as well as the structures of the olivine type such as $LiFePO_4$ are particularly dimensionally stable, and their use is preferred in the context of the present invention.

Likewise, these active anode and cathode materials are assembled using solid electrolytes in order to ensure a rigid and stable surface for the encapsulation and avoid the risk of deterioration of the latter during the cycles of use of the battery. These solid electrolytes can be polymers, ceramics, glasses, glass-ceramics and/or hybrid materials composed both of an organic and inorganic portion.

In order to ensure excellent protection against the gases of the atmosphere, it is necessary to have a protective film that has an extremely low WVTR. According to the prior art, the best protection is provided by metallic films, however the latter cannot cover the entirety of the battery without short-circuiting the electrodes.

After the stacking step (cf. FIGS. 4, 7 and 15) and before the addition of the interconnections, the stack is encapsulated in an encapsulation system according to the invention allowing to ensure the protection of the battery from the atmosphere.

Encapsulation System

The quality of the encapsulation is of crucial importance for lithium-ion batteries. The encapsulation system 30 according to the invention is chemically stable, resists a high temperature, provides protection against humidity and is impermeable to the atmosphere in order to carry out its role of barrier layer. It consists of a plurality of layers successively deposited on the stack (cf. FIGS. 5, 8, 27a, 27b, 28a, 28b, 29a, 29b, 30a and 30b), as described above.

To do this, the encapsulation system according to the invention consists of a plurality of layers successively deposited on the object, namely on the portions of the object needing to be protected.

This encapsulation system allows electrical insulation and impermeability of the electronic components or batteries while ensuring the possibility of being able to later electrically connect them to each other and/or to external connection points. This encapsulation system can also be carried out according to the first, the second or the third alternative of the invention.

Interconnections

After the step of encapsulation of the electronic or electrochemical component such as a battery by the encapsulation system or any one of its alternatives, interconnections are added in order to establish the electric contacts necessary for the correct operation of said component.

The interconnections described below can be made on electronic or electrochemical components such as a battery, obtained according to the first or the second embodiment, and coated by the encapsulation system according to the invention or any one of its alternatives, insofar as these combinations are possible for a person skilled in the art.

Figure 6:
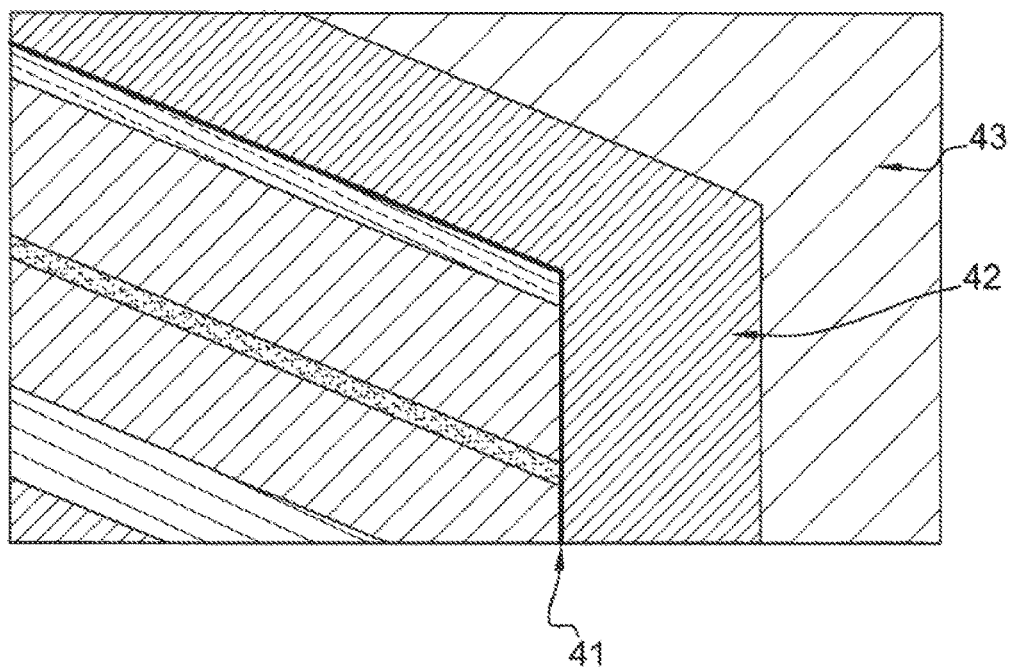
FIG. 6 is a perspective view with a cut analogous to FIG. 4 illustrating on a greater scale the inner structure of the interconnections.
Figure 10:
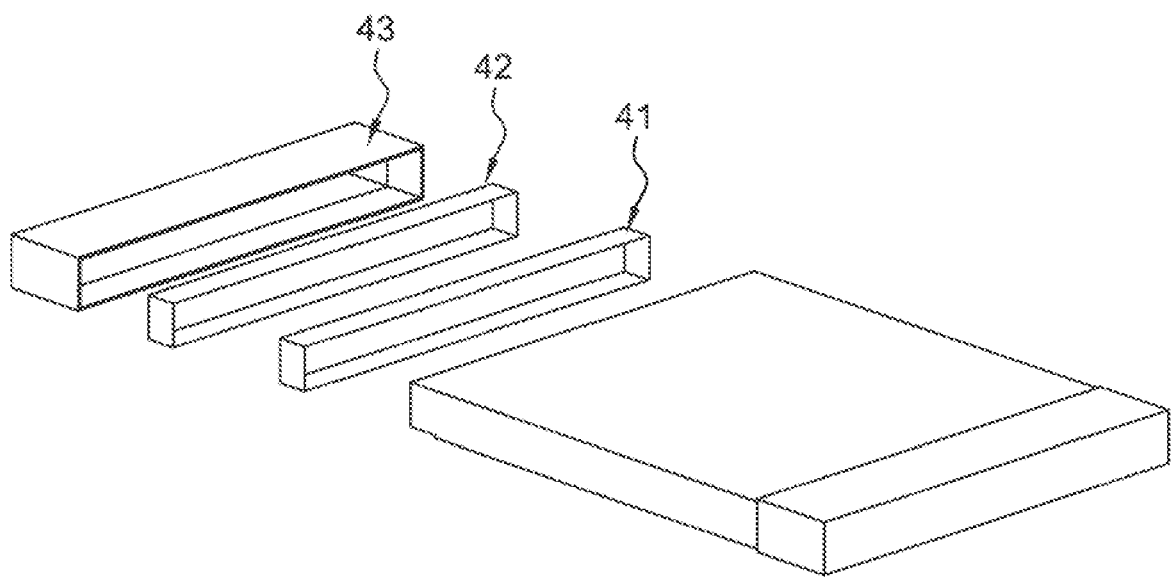
FIG. 10 shows an exploded perspective view of the interconnections of an all-solid battery, consisting of a stack of layers.

In order to make these interconnections 40, the stack coated by the encapsulation system or any one of its alternatives is cut according to cutting planes allowing to obtain unit battery components, with the exposure on each of the cutting planes of the (+) and (−) connections of the battery, namely in the protruding regions, so that the encapsulation system coats four of the six faces of said battery, preferably continuously, in order for the system to be able to be assembled without welding, the two other faces of the battery being later coated by the interconnections. Advantageously, the battery comprises interconnections where the cathode, respectively anode, current collectors are visible. Preferably, the anode connections and the cathode connections are located on the opposite sides of the stack. On and around these connections an interconnection system is deposited (cf. FIG. 6). The connections can then be metallized using plasma deposition techniques known to a person skilled in the art, preferably by ALD (cf. FIG. 6 or FIG. 10, reference 41) and/or by immersion in a conductive epoxy resin (loaded with silver—(cf. FIG. 6 or FIG. 10, reference 42) and/or a bath of molten tin (cf. FIG. 6 or FIG. 10, reference 43) or by electrolytic deposition. Preferably, the interconnections consist of a stack of layers successively comprising a first metallic covering thin film deposited by ALD 41, a second layer made of epoxy resin loaded with silver 42 deposited on the first layer and a third layer containing tin 43 deposited on the second layer.

The first conductive layer deposited by ALD 41 is used to protect the section of the battery against humidity. This first conductive layer deposited by ALD is optional. It allows to increase the calendar service life of the battery by reducing the WVTR at the interconnection. The second layer made of epoxy resin loaded with silver 42, allows to obtain "flexibility" for the connections without breaking the electric contact when the electric circuit is subjected to thermal and/or vibration stresses.

The third metallization layer containing tin 43 is used to reduce the WVTR, which increases the service life of the battery.

In another embodiment, this third layer can be composed of two layers of different materials. A first layer 43a in contact with the layer made of epoxy resin loaded with silver 42. This layer is made of nickel 43a and is created by electrolytic deposition. The layer made of nickel is used as a thermal barrier and protects the rest of the component from diffusion during the steps of assembly by reflow. The last layer 43b, deposited on the layer made of nickel 43a is also a metallization layer, preferably made of tin in order to make the interface compatible of the assemblies via reflow. This layer made of tin can be deposited either by dipping in a bath of molten tin or by electrodeposition; these techniques are known as such.

For certain assemblies on tracks made of copper via microwiring, it can be necessary to have a last metallization layer 43b made of copper. Such a layer can be created by electrodeposition in place of the tin.

In another embodiment, the interconnections can consist of a stack of layers successively comprising a layer of epoxy resin loaded with silver 42 and a second layer containing tin or nickel 43 deposited on the first layer.

In another embodiment, the interconnections can consist of a stack of layers successively comprising a layer of conductive polymer such as a layer made of epoxy resin loaded with silver 42, a second layer containing nickel 43a deposited on the first layer and a third layer containing tin or copper 43b.

In a preferred embodiment, the interconnections can consist of various layers that are respectively, in a non-limiting manner, a layer of conductive polymer such as an epoxy resin loaded with silver, a layer of nickel and a layer of tin.

The interconnections allow to connect the alternatingly positive and negative electric connections on each of the ends of the battery. These interconnections allow to carry out the electric connections in parallel between the various battery elements. For this, only the (+) connections stick out on one end (protruding region), and the (−) are available on the other ends (other protruding regions).

A first embodiment, which can be combined with the encapsulation system according to the invention or any one of its alternatives, will now be described.

Figure 7:
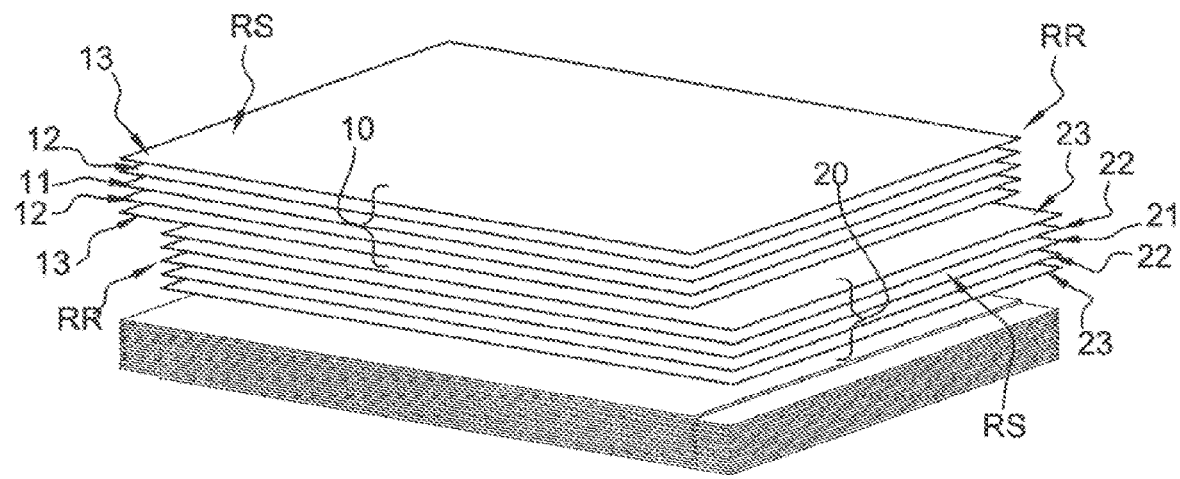
FIG. 7 shows an exploded perspective view of the stack of the anode and cathode thin films, in such a way that these layers are offset laterally.
Figure 8:
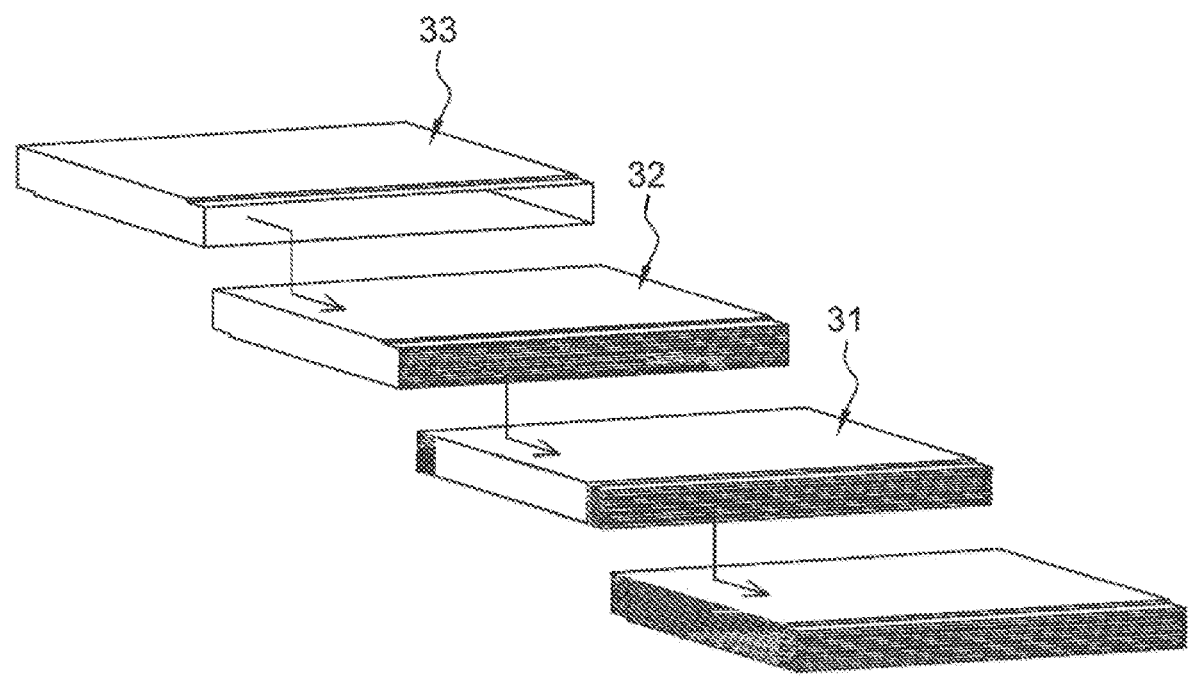
FIG. 8 shows an exploded perspective view of the system for encapsulating according to the invention the stack of the anode and cathode layers comprising a stack of covering layers.

Description of the Method for Manufacturing a Battery, Preferably an all-Solid Battery According to a First Embodiment FIG. 7 shows according to a first embodiment, just like FIG. 4, an all-solid battery comprising anodes 10 and cathodes 20, each consisting of a stack of thin films; the anodes and the cathodes are offset laterally in such a way as to form protruding regions RS, intended to form an accessible connection zone and set-back regions RR, intended to form a covering zone, i.e. a zone covered by the encapsulation system.

In this first embodiment and advantageously, the encapsulation of the battery is carried out on four of the six faces of the stack with it being understood that the cathode sections appearing on a first face and the anode sections appearing on a second face are not covered by this encapsulation system in such a way as to facilitate the collection of current on the lateral sides. The encapsulation layers surround the periphery of the stack, the rest of the atmosphere protection being ensured by the layers obtained by the interconnections.

Preferably the cathode and anode connections are offset laterally, which allows the encapsulation layer to function as a dielectric in order to prevent the presence of a short circuit on these ends.

Figure 9A:
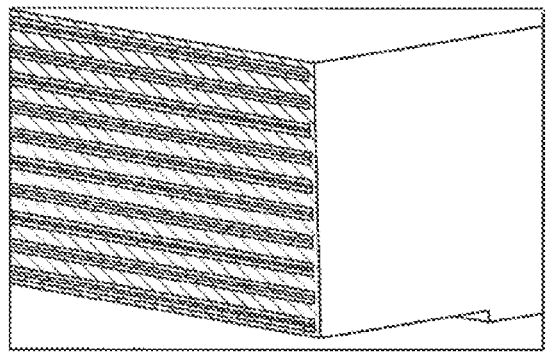
FIG. 9A shows a view at the outlet of the anode showing the anode current collectors surrounded on their periphery by the encapsulation system.
Figure 9B:
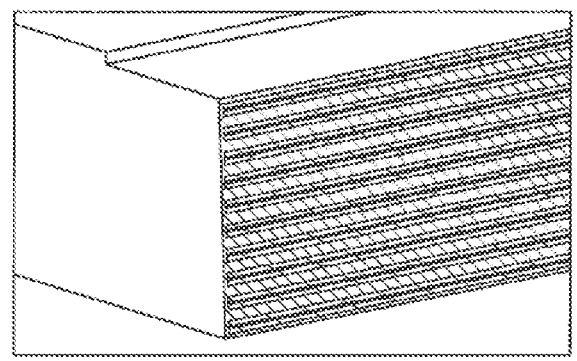
FIG. 9B shows a view at the outlet of the cathode showing the cathode current collectors surrounded on their periphery by the encapsulation system.

Once the stack has been made, and after the encapsulation of the stack, interconnections (electric contacts, cf. FIG. 6, reference 40) are added where the cathode, respectively anode current collectors are visible (not coated with insulating electrolyte). These contact zones can be on the opposite sides of the stack in order to collect the current (lateral current collectors) or on adjacent sides (cf. FIG. 9 A and FIG. 9 B).

Advantageously, the battery according to the invention obtained from a primary superposition, comprising an alternating succession of sheets of anode and of sheets of cathode as indicated above, is characterized in that said encapsulation system or any one of the alternatives 1 to 3 of said encapsulation system according to the invention totally coats four of the six faces of said battery and partly coats the two laterally opposite remaining faces, said two remaining faces being partly coated by at least said first covering layer 31,31' and at least said second layer 32,32' and said two remaining faces comprising an anode connection zone and a cathode connection zone. The third covering layer of said encapsulation system has difficulty penetrating the primary superposition. Consequently, this third layer has difficulty covering the two laterally opposite remaining faces.

Method for Simultaneously Manufacturing a Plurality of Batteries

First Embodiment

In order to increase the yield of production of the batteries, preferably of the all-solid batteries, the simultaneous manufacturing of a plurality of all-solid batteries can be carried out using a primary superposition of alternating sheets comprising between several tens of and several hundred anodes defined according to a cutting plane in the shape of a U and of sheets comprising between several tens of and several hundred cathodes defined according to a cutting plane in the shape of a U (cf. FIG. 11, first embodiment). All these sheets have perforations at their four ends in such a way that when these perforations are superimposed, all the cathodes and all the anodes of these sheets are superimposed and offset laterally (cf. FIGS. 12 and 13, first embodiment).

The encapsulation is then carried out as described above according to the arrows (F) present in FIGS. 12 and 13. These arrows indicate the zones covered by the encapsulation system according to the invention (set-back regions). The encapsulation system according to the invention fills the space present in the cutouts in the shape of a U positioned top to tail and offset as presented in FIGS. 12 and 13.

Advantageously, the primary superposition of sheets of anode and of sheets of cathode can be covered with the encapsulation system according to the first or the second or the third alternative as indicated above.

The primary superposition of sheets of anode and of cathode thus coated is then cut by any appropriate means in such a way as to expose the anode and cathode current collectors and obtain unit batteries.

Interconnections (electric contacts, cf. FIG. 15, reference 40, 41', 42' and 43') are added where the cathode, respectively anode current collectors are visible (not coated with insulating electrolyte). These contact zones are, preferably, disposed on the opposite sides of the stack of the battery in order to collect the current (lateral current collectors) or on adjacent sides.

A second embodiment, which can be combined with the encapsulation system according to the invention or any one of its alternatives, will now be described.

Second Embodiment

In another embodiment, the simultaneous manufacturing of a plurality of batteries, preferably of a plurality of all-solid batteries can be carried out using an alternating primary superposition of sheets comprising between several tens of and several hundred anodes 10' having notches 50, 50' and of sheets comprising between several tens of and several hundred cathodes 20' having notches 50", 50'''. All these sheets have notches, preferably concentric orifices or holes in such a way that when these perforations are superimposed, all the cathodes and all the anodes of these sheets define at least one protruding region RS, intended to form an accessible connection zone, as well as at least one set-back region RR, intended to form a covering zone, i.e. a zone covered by the encapsulation system (cf. FIGS. 16, 17, 18 and 19). In FIG. 16, each anode sheet comprises an alternating succession of holes having diameters D1 and D2 where D2 is a diameter smaller than D1 and each cathode sheet comprises an alternating succession of holes having diameters D2 and D1 where D2 is a diameter smaller than D1, in such a way that the holes present on the sheets of anode having a diameter D1 (respectively D2) and of cathode having a diameter D2 (respectively D1) are concentric. FIG. 19 shows a perspective view analogous to FIG. 16 illustrating on a greater scale the primary superposition of sheets of anode and of sheets of cathode, and namely the superposition of the concentric holes having different diameters D1 and D2 present on these sheets highlighting the protruding regions and the set-back regions.

The primary superposition of sheets of anode and of sheets of cathode is then covered with the encapsulation system according to the invention comprising:

- a first covering layer of the encapsulation system 31', identical to the first covering layer of the encapsulation system 31 and deposited on the stack by an atomic layer deposition method,
- a second encapsulation layer 32' comparable to the second encapsulation layer 32 deposited on the first encapsulation layer in order to improve the protection of the cells of the batteries from their outside environment,
- a third layer 33 comparable to the third layer 33' deposited on the second encapsulation layer (cf. FIGS. 22 and 23).

Alternatively, the primary superposition of sheets of anode and of sheets of cathode can be covered with the encapsulation system according to the first or the second or the third alternative as indicated above.

The primary superposition of sheets of anode and of cathode thus coated is then perforated at the concentric perforations by any appropriate means in such a way that the diameter of these new perforations is between D1 and D2 and thus reveals for each hole, either the anode connections or the cathode connections, i.e. the (+) and (−) connections of the battery (cf. FIGS. 21A and 21B) in order to facilitate the collection of current in the lateral concentric holes.

After a cut called tertiary, in a median portion of said primary superposition, unit batteries are obtained (cf. FIG. 20) and interconnections (electric contacts, cf. FIG. 24, reference 40, FIG. 27 reference 41', 42' and 43') are added where the cathode, respectively anode current collectors are visible (not coated with insulating electrolyte). These contact zones are, preferably, disposed on the opposite sides of the stack of the battery in order to collect the current (lateral current collectors) or on adjacent sides (cf. FIGS. 24, 25 to 27).

The connections are metallized using plasma deposition techniques known to a person skilled in the art, preferably by ALD (cf. FIG. 27, reference 41') and/or by immersion in a conductive epoxy resin loaded with silver—(cf. FIG. 27, reference 42') and/or a bath of molten tin (cf. FIG. 27, reference 43'). Preferably, the interconnections consist of a stack of layers successively comprising a first metallic covering thin film deposited by ALD 41', a second layer made of epoxy resin loaded with silver 42' deposited on the first layer and a third layer containing tin 43' deposited on the second layer. The interconnections allow to connect the alternatingly positive and negative electric connections on each of the concentric ends. These interconnections allow to carry out the electric connections in parallel between the various battery elements. For this, only the (+) connections stick out on one concentric end, and the (−) are available on another concentric end.

EXAMPLES

The invention is illustrated below by examples which do not however limit the invention. These examples relate to the preparation of an all-solid battery and to the encapsulation of such a battery.

1. Preparation of a Lithium-Ion Battery

A suspension of the anode material at 10 g/l was obtained by grinding followed by dispersion of $Li_4Ti_5O_{12}$ in absolute ethanol with addition of several ppm of citric acid. A suspension of cathode material at 25 g/l was obtained by grinding followed by dispersion of $LiMn_2O_4$ in absolute ethanol. The cathode suspension was then diluted in acetone down to a concentration of 5 g/l. The suspension of electrolyte material at 5 g/l was obtained by grinding then dispersion of a powder of $Li_3Al_{0.4}Sc_{1.6}(PO_4)_3$ in absolute ethanol.

For all these suspensions, the grinding was carried out in such a way as to obtain stable suspensions with a particle size of less than 100 nm.

The negative electrodes were prepared by electrophoretic deposition of the nanoparticles of $Li_4Ti_5O_{12}$ contained in the suspension previously prepared. The thin film of $Li_4Ti_5O_{12}$ (thickness approximately 1 μm) was deposited on the two faces of the substrate. These negative electrodes were then annealed at 600° C.

The positive electrodes were prepared in the same manner, by electrophoretic deposition using the suspension of $LiMn_2O_4$. The thin film of $LiMn_2O_4$ (thickness approximately 1 μm) was deposited on the two faces of the substrate. These positive electrodes were then annealed at 600° C.

After annealing the negative electrodes and the positive electrodes were covered with a layer of $Li_3Al_{0.4}Sc_{1.6}(PO_4)_3$ electrolyte by EPD. The thickness of the $Li_3Al_{0.4}Sc_{1.6}(PO_4)_3$ was approximately 500 nm on each electrode. These films of electrolyte were then dried.

The stack of the $Li_3Al_{0.4}Sc_{1.6}(PO_4)_3$-coated anodes and cathodes was then created in such a way as to obtain a laterally offset multilayer stack (cf. FIG. 7). The entirety was then maintained under pressure for 15 minutes at 600° C. in order to carry out the assembly.

2. Encapsulation of the Battery

The encapsulation system was then deposited on the preceding multilayer stack. A layer of alumina $Al_2O_3$ representing the first layer of the encapsulation system was deposited by ALD). The multilayer stack of the coated anodes and cathodes was introduced into the chamber of a Picosun™ P300 ALD reactor. The chamber of the ALD reactor was previously placed under vacuum at 5 hPa and at 180° C. and previously subjected for 30 minutes to a flow of trimethylaluminum (hereinafter TMA)—(CAS: 75-24-1), a chemical precursor of alumina under nitrogen containing less than 3 ppm ultra-pure water of type 1 ($\sigma \approx 0.05$ μS/cm) as a carrier gas at a flow rate of 150 sccm (standard cm3/min), in order to stabilize the atmosphere of the chamber of the reactor before any deposition. After stabilization of the chamber, a layer of Al2O3 of 100 nm was deposited by ALD.

A film of parylene N 12 μm+/−2 μm thick was then deposited by CVD on this first layer of alumina.

A third encapsulation layer was then deposited on this second layer. Said layer can be made from epoxy resin, polyethylene naphthalate (PEN), silicone, polyimide, polyamide or polyurethane. Preferably, it is made from an epoxy resin. This third layer was then hardened under ultraviolet radiation (UV) in such a way as to reduce the speed of degradation of the battery by atmospheric elements.

3. Creation of the Interconnections of the Battery

The stack thus encapsulated was then cut along cutting planes allowing to obtain a unit battery, with the exposure on each of the cutting planes of the cathode, respectively anode current collectors of the battery. The encapsulated stack was thus cut on two of the six faces of the stack in such a way as to reveal the cathode, respectively anode current collectors. Interconnections were then added where the cathode, respectively anode current collectors are visible (not coated with insulating electrolyte).

The connections were then made electrically conductive, preferably metallized, by atomic layer deposition (ALD). This first interconnection thin film can namely be metallic or contain metallic nitride. This first interconnection layer was then immersed in a conductive epoxy resin (loaded with silver) then immersed in a bath of molten tin.

The battery thus obtained was cycled between 2 and 2.7V.

LIST OF REFERENCE SYMBOLS

1 All-solid battery
2 Elementary cell
3 Stack of sheets of anodes and of cathode
10, 10' Anode
11, 11' Thin film of a conductive substrate (e.g., stainless steel)
12, 12' Thin film of an active anode material
13, 13' Thin film of an electrolyte material
20, 20' Cathode
21, 21' Thin film of a conductive substrate (e.g., stainless steel)
22, 22' Thin film of an active cathode material
23, 23' Thin film of an electrolyte material
30, 30' Encapsulation system
31, 31', 31a, 31b, 31n 1st covering thin film
32, 32', 32a, 32b, 32n 2nd covering layer
32''', 32'''' Layers capable of forming 2nd covering layer
33, 33' 3rd covering layer
40, 40' Interconnections
41, 41' Metallic layer deposited by ALD
42, 42' Layer made of epoxy resin loaded with Ag
43, 43' Metallization layer (tin)
43a First metallization layer
43b Second metallization layer
50 Pretreatment layer
50a First pretreatment layer
50b Second pretreatment layer
1000 Object (e.g., electronic or electrochemical component)
F Arrow indicating the zones covered by encapsulation system
RS Protruding region
RR Set-back region
ZRT Covering zone
ZC Connection zones
III through XII Magnifications
II-II, XII-XII, XIX-XIX Axes
XIX'-XIX', XXI-XXI Axes
XXI'-XXI', XXV-XXV Axes
XXV'-XXV' Axes

What is claimed is:

1. A system for encapsulating a battery, the system comprising:
a plurality of covering layers that include:
a first covering layer composed of an electrically insulating material deposited by atomic layer deposition, which at least partly covers said battery,
a second covering layer disposed on the first covering layer, and
a third covering layer disposed on the second covering layer to protect the second covering layer with respect to oxygen,
wherein:
said battery comprises a stack alternating between at least one anode and at least one cathode, that respectively include a stack of thin films,
the at least one anode includes at least one thin film of an active anode material, or at least one thin film of an active anode material and a thin film of an electrolyte material,
the at least one cathode includes at least one thin film of an active cathode material, or at least one thin film of an active anode material and a thin film of an electrolyte material such that the battery successively has at least one thin film of an active anode material, at least one thin film of an electrolyte material, and at least one thin film of an active cathode material,
the at least one anode has at least one anode connection zone or the at least one cathode has at least one cathode connection zone, and an adjacent at least one cathode or an adjacent at least one anode having a covering zone which is covered by at least the first covering layer and the second covering layer, and
the covering zone is located facing the at least one anode connection zone or the at least one cathode connection zone in a direction perpendicular to a plane of the stack.

2. The system of claim 1, wherein the second covering layer comprises parylene and/or polyimide.

3. The system of claim 1, wherein said electrically insulating material is selected from the group consisting of $Al_2O_3$, $SiO_2$, $SiO_yN_x$, and epoxy resins.

4. The system of claim 1, wherein the second covering layer comprises parylene N.

5. The system of claim 1, wherein the thickness of:
the first covering layer is less than 200 nm,
the second covering layer is between 1 μm and 50 μm, and
the third covering layer is between 1 μm and 50 μm.

6. The system of claim 1, further comprising a fourth covering layer comprising parylene and/or polyimide formed on the battery, and wherein the first covering layer is disposed on the fourth covering layer.

7. The system of claim 1, wherein:
the at least one anode connection zone is covered with a thin film of an electronic conductor to establish an electrical connection to other anode connection zones in the at least one anode connection zone, and
the at least one cathode connection zone is covered with a thin film of an electronic conductor to establish an electrical connection to other cathode connection zones in the at least one cathode connection zone.

8. The system of claim 7, wherein:
the at least one anode connection zone is metallized, and
the at least one cathode connection zone is metallized.

9. The system of claim 8, wherein the at least one anode connection zone and the at least one cathode connection zone are electrically connected to each other by an interconnection system successively comprising:
a first electrically conductive layer on the at least one anode connection zone and the at least one cathode connection zone,
a second layer, containing epoxy resin impregnated with silver, on the first electrically conductive layer or on the at least one anode connection zone and the at least one cathode connection zone, and
a third layer, containing tin, on the second layer.

10. The system of claim 8, wherein the at least one anode connection zone and the at least one cathode connection zone are electrically connected to each other by an interconnection system successively comprising:
a first electrically conductive layer on the at least one anode connection zone and the at least one cathode connection zone,
a second layer, containing epoxy resin impregnated with silver, on the first electrically conductive layer or on the at least one anode connection zone and the at least one cathode connection zone,
a third layer, containing nickel, on the second layer, and
a fourth layer, containing tin or copper, on the third layer.

11. The system of claim 8, wherein:
the battery has six faces,
the encapsulation system totally coats four faces of the six faces and partially coats two laterally opposite remaining faces,
two remaining faces comprise an anode connection zone and a cathode connection zone, and
the two remaining faces are partially coated by at least the first covering layer and at least the second layer.

12. A battery, comprising:
at least one anode including at least one thin film of an active anode material, or at least one thin film of an active anode material and a thin film of an electrolyte material;
at least one cathode including at least one thin film of an active cathode material, or at least one thin film of an active anode material and a thin film of an electrolyte material so that the battery successively includes at least one thin film of the active anode material, at least one thin film of the electrolyte material, and at least one thin film of the active cathode material;
a primary superposition of a stack of thin films alternating between the at least one anode and the at least one cathode; and
an encapsulation system for the battery, the encapsulation system having a plurality of covering layers that include:
a first covering layer at least partially covering the stack, the first covering layer composed of an electrically insulating material,
a second covering layer composed of parylene and/or polyimide, disposed on the first covering layer, and
a third covering layer disposed on the second covering layer in such a way as to protect the second covering layer from exposure to oxygen, and thereby increase the service life of the electronic component or the electrochemical component,
wherein:
the at least one anode or the at least one cathode includes at least one accessible connection zone, and
at least one adjacent cathode or at least one adjacent anode includes a covering zone which is covered by at least the first covering layer and the second covering layer, the covering zone being located facing the connection zones of the at least one first anode or the at least one cathode, in a direction perpendicular to a plane of the stack.

13. The battery of claim 12, wherein:
the at least one anode connection zone is covered with a thin film of an electronic conductor to establish an electrical connection to other anode connection zones in the at least one anode connection zone, and
the at least one cathode connection zone is covered with a thin film of an electronic conductor to establish an electrical connection to other cathode connection zones in the at least one cathode connection zone.

14. The battery of claim 12, wherein:
the at least one anode connection zone is metallized, and
the at least one cathode connection zone is metallized.

15. The battery of claim 12, wherein the at least one anode connection zone and the at least one cathode connection zone are electrically connected to each other by an interconnection system successively comprising:
a first electrically conductive layer on the at least one anode connection zone and the at least one cathode connection zone,
a second layer, containing epoxy resin impregnated with silver, on the first electrically conductive layer or on the at least one anode connection zone and the at least one cathode connection zone, and
a third layer, containing tin, on the second layer.

16. The battery of claim 12, wherein the at least one anode connection zone and the at least one cathode connection zone are electrically connected to each other by an interconnection system successively comprising:
a first electrically conductive layer on the at least one anode connection zone and the at least one cathode connection zone,
a second layer, containing epoxy resin impregnated with silver, on the first electrically conductive layer or on the at least one anode connection zone and the at least one cathode connection zone,
a third layer, containing nickel, on the second layer, and
a fourth layer, containing tin or copper, on the third layer.

17. A system, comprising:
an electronic component or an electrochemical component that includes a primary superposition of a stack of thin films alternating between at least one anode and at least one cathode, the at least one anode including at least one thin film of an active anode material or at least one thin film of an active anode material and a thin film of an electrolyte material, and the at least one cathode including at least one thin film of an active cathode material or at least one thin film of an active anode material and a thin film of an electrolyte material so that the electronic component or the electrochemical component successively includes at least one thin film of the active anode material, at least one thin film of the electrolyte material, and at least one thin film of the active cathode material;

an encapsulation system for the electronic component or an electrochemical component, the encapsulation system having a plurality of covering layers that include:
  a first covering layer at least partially covering the stack, the first covering layer being composed of an electrically insulating material,
  a second covering layer composed of parylene and/or polyimide, disposed on the first covering layer, and
  a third covering layer disposed on the second covering layer to protect the second covering layer from exposure to oxygen, wherein:

the at least one anode or the at least one cathode includes at least one accessible connection zone, and at least one adjacent cathode or at least one adjacent anode includes a covering zone which is covered by at least the first covering layer and the second covering layer, the covering zone being located facing the connection zones of the at least one first anode or the at least one cathode, in a direction perpendicular to a plane of the stack.

* * * * *